US008203611B2

(12) United States Patent
Honda et al.

(10) Patent No.: US 8,203,611 B2
(45) **Date of Patent: *Jun. 19, 2012**

(54) IMAGING APPARATUS HAVING ELECTRON SOURCE ARRAY

(75) Inventors: Yuki Honda, Tokyo (JP); Masakazu Namba, Tokyo (JP); Yoshiyuki Hirano, Tokyo (JP); Saburo Okazaki, Tokyo (JP); Norifumi Egami, Tokyo (JP); Toshihisa Watabe, Tokyo (JP); Yoshiro Takiguchi, Tokyo (JP); Akira Kobayashi, Hamamatsu (JP); Shigeo Itoh, Mobara (JP); Masateru Taniguchi, Mobara (JP); Kazuhito Nakamura, Mobara (JP); Kenta Miya, Mobara (JP); Yoshiyuki Okuda, Tsurugashima (JP); Kazuto Sakemura, Tsurugashima (JP)

(73) Assignees: Nippon Hoso Kyokai, Tokyo (JP); Hamamatsu Photonics K.K., Hamamatsu-Shi (JP); Futaba Corporation, Mobara-Shi (JP); Pioneer Corporation, Tokyo (JP)

( * ) Notice: Subject to any disclaimer, the term of this patent is extended or adjusted under 35 U.S.C. 154(b) by 1065 days.

This patent is subject to a terminal disclaimer.

(21) Appl. No.: 12/123,707

(22) Filed: May 20, 2008

(65) Prior Publication Data

US 2008/0291307 A1 Nov. 27, 2008

(30) Foreign Application Priority Data

May 21, 2007 (JP) ................................ 2007-134788

(51) Int. Cl.
*H01J 29/04* (2006.01)
*H01L 31/00* (2006.01)

(52) U.S. Cl. ...................... 348/162; 348/166; 250/208.1

(58) Field of Classification Search .................. 348/162, 348/166, 302; 250/208.1, 214.1
See application file for complete search history.

(56) References Cited

U.S. PATENT DOCUMENTS 5,488,386 A 1/1996 Yamagishi et al.
7,723,664 B2 * 5/2010 Honda et al. ............... 250/208.1
7,834,308 B2 * 11/2010 Namba et al. ............. 250/214.1
(Continued)

FOREIGN PATENT DOCUMENTS

JP 6-176704 6/1994
(Continued)

OTHER PUBLICATIONS

Y. Honda, "Spindt-type FEA Image Sensor with Ultrahigh-sensitivity HARP Target", The Institue of Electronics, Information and Communication Engineers (IEICE Technical Report), ED2005-113, OME2005-39, Sep. 2005, pp. 27-32 (with English Abstract).

(Continued)

*Primary Examiner* — Bharat N Barot
(74) *Attorney, Agent, or Firm* — Oblon, Spivak, McClelland, Maier & Neustadt, L.L.P.

(57) ABSTRACT

An imaging apparatus includes an electron emission array having electron sources arranged in matrix form, a photoelectric conversion film opposed to the electron emission array, and a control and drive circuit configured to select one or more horizontal scan lines in a given video signal output period and to cause the electron sources included in the selected one or more horizontal scan lines to emit electrons toward the photoelectric conversion film, wherein the control and drive circuit is further configured to cause the electron sources included in the selected one or more horizontal scan lines to emit electrons toward the photoelectric conversion film in any one or more blanking periods excluding both a blanking period immediately following the given video signal output period and a blanking period immediately preceding a next video signal output period in which the one or more horizontal scan lines will be selected next time.

12 Claims, 20 Drawing Sheets

U.S. PATENT DOCUMENTS

2008/0158138 A1* 7/2008 Yamazaki et al. ............ 345/102

FOREIGN PATENT DOCUMENTS

JP 2004-134144 4/2004

OTHER PUBLICATIONS

U.S. Appl. No. 12/123,719, filed May 20, 2008, Namba, et al.
U.S. Appl. No. 12/123,987, filed May 20, 2008, Honda, et al.

* cited by examiner

EVEN-NUMBER FIELD

IMAGING APPARATUS HAVING ELECTRON SOURCE ARRAY

BACKGROUND OF THE INVENTION

1. Field of the Invention

The disclosures herein relate to an imaging apparatus provided with a photoelectric conversion film and an electron source array having electron sources arranged in matrix form wherein electrons are emitted from the electron source array during a video signal output period and a vertical blanking period.

2. Description of the Related Art

Research has been conducted for some time with respect to imaging apparatus that is provided with a photoelectric conversion film and an electron emission array having a matrix of electron emission sources, from which electrons are drawn out by an electric field without application of heat. This electron emission array has a plurality of Spindt-type emitters arranged in matrix form, which are opposed to the photoelectric conversion film across vacuum space. In such imaging device, holes that are generated and accumulated in the photoelectric conversion film in response to light arriving from an external source are read out by using electrons successively emitted from the Spindt-type emitter array, thereby producing a time sequence of video signals (see Patent Document 1).

An imaging apparatus of this type is known to suffer a capacitive residual image whose time constant is determined by a product of a static capacitance of the photoelectric conversion film and an equivalent resistance resulting from energy distribution of electrons emitted from the electron emission array.

When highly bright light enters the photoelectric conversion film, it may not be possible to read out, within a predetermined time period, all the holes generated and accumulated in the photoelectric conversion film by using electrons emitted from the electron emission array. In this case, a prominent residual image is created. This gives rise to a problem that an output image has degraded motion resolution and significantly reduced time resolution.

An imaging apparatus of this type is not provided with an electronic shutter function, which is adopted in a solid-state imaging device such as a CCD (Charge Coupled Device). When capturing an image of an object in motion, thus, it is impossible to compensate for degradation in motion resolution resulting from the accumulation, over a period of 1 field or 1 frame, of electric charge that is created by light entering the photoelectric conversion film.

Another problem is that an output image has flickers when images are taken under the lighting condition in which light is driven by a frequency lower than the field frequency or frame frequency of the imaging apparatus.

In order to overcome these problems, study has been conducted with respect to an imaging device in which the thickness of the photoelectric conversion film is increased, for example. In such imaging device, an increased thickness of the photoelectric conversion film serves to decrease the static capacitance, thereby reducing a capacitive residual image (see Non-Patent Document 1, for example).

Also, Patent Document 1 discloses forming a photoelectric conversion film on separate stripe-shape translucent electrodes and scanning the photoelectric conversion film formed on two adjacent translucent electrodes by use of two electron beams simultaneously emitted from the electron emission array.

In this imaging apparatus, the first electron beam is used to read holes generated and accumulated in the photoelectric conversion film to produce a video signal, and the second electron beam is used to remove the holes remaining in the photoelectric conversion film immediately after the scanning by the first electron beam. This serves to reduce a residual image.

Research has also been conducted with respect to another method that is different from the methods described above. In this method, voltage continues to be applied to a gate electrode during a residual charge sweeping period that follows immediately after an image signal output period, during which a pixel signal for a horizontal scan line is read (see Patent Document 2, for example).

Patent Document 2 further discloses applying a voltage to the gate electrode of a next horizontal scan line in an excessively-accumulated charge sweeping period following the residual charge sweeping period and setting the potential of cathode electrodes higher than the potential of a reference scan surface. This serves to remove the accumulated electric charge that is provided in excess of the amount readable within the video signal output period. With this arrangement, white saturation, smear, and resolution degradation resulting from imaging a highly bright object are prevented, thereby offering similar advantages to the use of an electronic shutter in a solid-state imaging device.

The method disclosed in Non-patent Document 1 increases the thickness of a photoelectric conversion film in an imaging device in which the photoelectric conversion film is opposed, across vacuum space, to an electron emission array having a matrix of electron emission sources. This reduces the static capacitance of the film, thereby suppressing a capacitive residual image.

Such method, however, can only reduce the static capacitance of the photoelectric conversion film. It is theoretically impossible to eliminate the static capacitance. A capacitive residual image thus sill occurs. Especially when the value of equivalent resistance resulting from energy distribution of electrons emitted from the electron emission array is large or when a large number of holes are generated and accumulated in the photoelectric conversion film in response to highly bright light, the occurrence of a capacitive residual image becomes prominent. This gives rise to a problem in that motion resolution is degraded in output images.

In the imaging apparatus using two electron scan beams for a photoelectric conversion film formed on separate stripe-shape translucent electrodes, it is necessary to shorten the intervals between adjacent translucent electrodes in order to reduce invalid imaging areas. There is thus an increase in static capacitance between the adjacent translucent electrodes. As a result, a portion of a video image generated by one of the electron beams is removed by the static capacitance existing between the adjacent translucent electrodes. This gives rise to the problem of lowered sensitivity and the like.

By the same token, the static resistance existing between adjacent translucent electrodes causes a video signal generated by one of the electron beams to be mixed with a signal that is generated upon removal of electric charge remaining in the photoelectric conversion film by the other electron beam immediately after the scan. This gives rise to a problem in that a pseudo signal comes into existence due to crosstalk.

In the imaging device described in Patent Document 2 in which voltage continues to be applied to a gate electrode during a residual charge sweeping period that follows immediately after an image signal output period during which a pixel signal for a horizontal scan line is read, the potential of the photoelectric conversion film on its scan side is reset to a potential close the cathode potential of electron emission sources immediately after the outputting of a video signal.

Further, if the potential of the photoelectric conversion film on its scan side is close to the cathode potential, the speed of electrons in a direction perpendicular to the photoelectric conversion film decreases as the electrons come close to the photoelectric conversion film. The speed will be slow in the vicinity of the photoelectric conversion film.

Immediately before video signals adjacent to each other are output, on the other hand, the potential of the photoelectric conversion film on its scan side is significantly higher than the cathode potential. This is because holes generated by incident light are accumulated over a period of one field or one frame.

Because of this, electrons emitted for the purpose of removing residual holes in the photoelectric conversion film during the residual charge sweeping period mostly fail to reach the photoelectric conversion film at low potential immediately after the outputting of a video signal. The trajectories of these electrons are vent toward the portion of the photoelectric conversion film that is at significantly higher potential immediately before the outputting of a video signal. (This phenomenon will hereinafter be referred to as "vending".) The electrons end up removing the holes accumulated there that constitute a video signal component. Accordingly, the method disclosed in Patent Document 2 suffers a problem in that the vending of electrons as described above limits the capacity of suppressing a residual image, and significantly lowers sensitivity.

In an electron emission array from which electrons are drawn out by an electric field, the amount of electrons emitted from electron emission sources may greatly vary from source to source on a given horizontal scan line. Also, the amount of electrons emitted from each electron emission source significantly varies with time.

As a result, the amount of holes existing immediately prior to scan that are neutralized by electrons having their trajectories vent by vending varies significantly from source to source, and varies significantly with time. An output image thus has sensitivity variation from pixel to pixel (i.e., variation in brightness from pixel to pixel in the image). Image quality thus noticeably drops.

In the imaging device described in Patent Document 2 in which a voltage is applied to the gate electrode of a next horizontal scan line in an excessively-accumulated charge sweeping period and the potential of cathode electrodes is set higher than the potential of a reference scan surface, it is only possible to prevent white saturation, smear occurrence, and resolution degradation. It is not possible to achieve the same operation as that of an electronic shutter used in a solid-state imaging device.

Electronic-shutter operation in a solid-state imaging device removes electric charge generated and accumulated in photodiodes in a partial period of a field period, for example, and reads electric charge generated and accumulated in the photodiodes in the remaining partial period. With this arrangement, motion resolution is improved. There has been a long-felt need for the provision of such electronic-shutter operation in the imaging apparatus as described above.

Accordingly, there is a need for a high-time-resolution imaging apparatus which is provided with an electronic shutter function, and can suppress occurrence of residual images without causing the lowering of sensitivity and image quality degradation resulting from sensitivity variation and/or crosstalk.

[Patent Document 1] Japanese Patent Application Publication No. 6-176704
[Patent Document 2] Japanese Patent Application Publication No. 2004-134144
[Non-patent Document 1] Honda et al., "Spindt-type FEA Image Sensor with Ultrahigh-sensitivity HARP Target," Technical report of IEICE, ED2005-113, pp. 27-32, Japan, September 2005

SUMMARY OF THE INVENTION

An imaging apparatus of at least one embodiment includes an electron emission array having electron sources arranged in matrix form and having a plurality of horizontal scan lines, a photoelectric conversion film opposed to the electron emission array, and a control and drive circuit configured to select one or more of the horizontal scan lines in a given video signal output period and to cause the electron sources included in the selected one or more horizontal scan lines to emit electrons toward the photoelectric conversion film to produce a video signal, wherein the control and drive circuit is further configured to cause the electron sources included in the selected one or more horizontal scan lines to emit electrons toward the photoelectric conversion film in any one or more blanking periods excluding both a blanking period immediately following the given video signal output period and a blanking period immediately preceding a next video signal output period in which the one or more horizontal scan lines will be selected next time.

Further, such any one or more blanking periods may include a plurality of blanking periods intervening between an end of the given video signal output period and a start of the next video signal output period.

Moreover, the plurality of blanking periods may includes a given blanking period and a blanking period next following the given blanking period.

Alternatively, a blanking period during which electrons are emitted from the electron sources included in the selected one or more horizontal scan lines selected in the given video signal output period may differ from a blanking period during which electrons are emitted from the electron sources included in one or more horizontal scan lines selected in another video signal output period.

Alternatively, at least one of the plurality of blanking periods during which electrons are emitted from the electron sources included in the selected one or more horizontal scan lines selected in the given video signal output period may differ from any one or more blanking periods during which electrons are emitted from the electron sources included in one or more horizontal scan lines selected in another video signal output period.

Alternatively, such any one or more blanking periods during which electrons are emitted from the electron sources included in one of the selected one or more horizontal scan lines may differ from such any one or more blanking periods during which electrons are emitted from the electron sources included in another one of the selected one or more horizontal scan lines.

Further, the electron emission array may include a first electrode for emitting electrons and a second electrode for creating a potential gap with the first electrode, and a potential gap may be created between the first electrode and the second electrode to draw out electrons from the first electrode.

Moreover, a potential gap created between the first electrode and the second electrode in said any one or more blanking periods may be set larger than a potential gap created between the first electrode and the second electrode in the given video signal output period.

Further, at least one of the first electrode and the second electrode may receive a voltage in such any one or more blanking periods, the voltage being identical to a voltage applied in the given video signal output period.

Moreover, the photoelectric conversion film may be configured to generate electric charge therein in response to light arriving from an external source, and is configured to amplify the electric charge therein.

A signal level detecting unit may further be provided to detect a signal level of the video signal output from the selected one or more horizontal scan lines in the given video signal output period, wherein a time length during which electrons are emitted from the electron sources included in the selected one or more horizontal scan lines toward the photoelectric conversion film in such any one or more blanking periods may vary depending on the signal level of the video signal detected by the signal level detecting unit.

By the same token, a signal level detecting unit may be provided to detect a signal level of the video signal output from the selected one or more horizontal scan lines in the given video signal output period, wherein a potential gap created between the first electrode and the second electrode in the electron sources included in the selected one or more horizontal scan lines in said any one or more blanking periods may vary depending on the signal level of the video signal detected by the signal level detecting unit.

According to at least one embodiment, the imaging device can be provided with an electronic shutter function, and can prevent occurrence of residual images without causing the lowering of sensitivity and image quality degradation resulting from pixel-specific sensitivity variation and/or crosstalk.

Other objects and further features of the present invention will be apparent from the following detailed description when read in conjunction with the accompanying drawings.

BRIEF DESCRIPTION OF THE DRAWINGS

FIGS. 2A and 2B are drawings showing the configuration of an imaging device included in the imaging apparatus of the first embodiment, wherein FIG. 2A is a partial-cross-sectional perspective view showing the schematic configuration of the imaging device, and FIG. 2B is a cross-sectional view showing a portion of the imaging device in an enlarged view;

DESCRIPTION OF THE PREFERRED EMBODIMENTS

In the following, embodiments to which an imaging apparatus of the present invention is applied will be described.

First Embodiment

Figure 1:
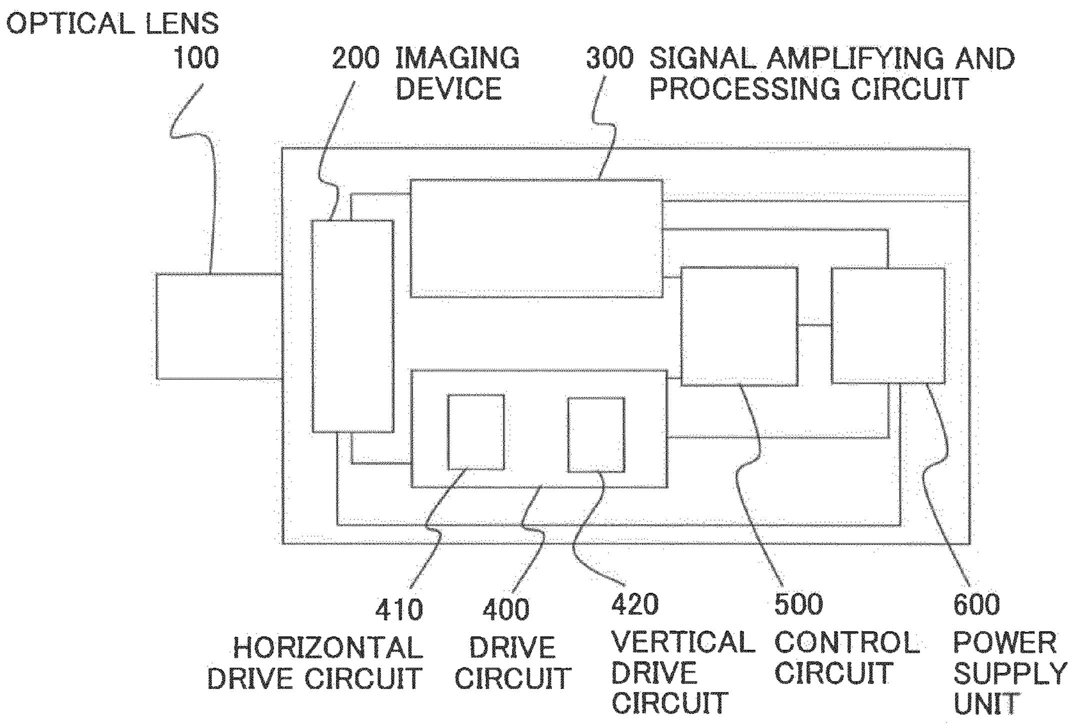
FIG. 1 is a schematic cross-sectional view of an imaging apparatus according to a first embodiment.

FIG. 1 is a schematic cross-sectional view of an imaging apparatus according to a first embodiment. The imaging apparatus of this embodiment includes an optical lens 100, an imaging device 200, a signal amplifying and processing circuit 300, a drive circuit 400, a control circuit 500, and a power supply unit 600.

The optical lens 100 and the imaging device 200 are arranged such that light passing through the optical lens 100 enters the photoelectric conversion film of the imaging device 200 perpendicularly to form a focus thereon.

The signal amplifying and processing circuit 300 amplifies and processes video signals output from the imaging device 200.

The drive circuit 400 includes a horizontal drive circuit 410, a vertical drive circuit 420, etc., and generates pulse voltages necessary to drive the imaging device 200.

The control circuit 500 generates a clock signal, synchronizing signals, and the like, and supplies these signals to the drive circuit 400 and the signal amplifying and processing circuit 300.

The power supply unit 600 supplies power to the imaging device 200, the signal amplifying and processing circuit 300, the drive circuit 400, and the control circuit 500.

In the case where the drive circuit 400 is embedded in the imaging device 200, the control circuit 500 supplies the clock signal and synchronizing signals directly to such an embedded drive circuit. Also, the power supply unit 600 directly supplies power necessary for driving to the imaging device 200.

Figure 2A:
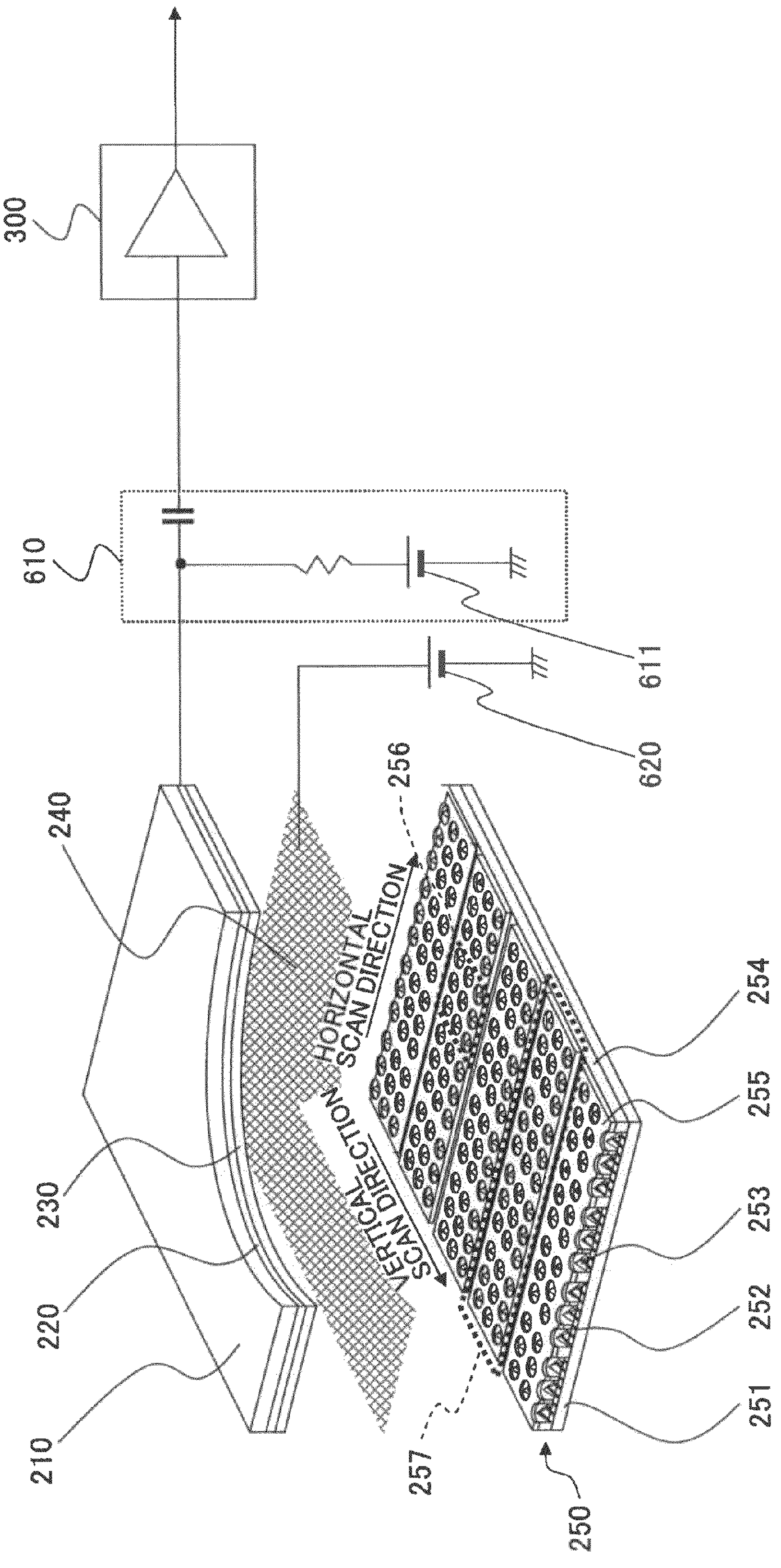
Figure 2B:
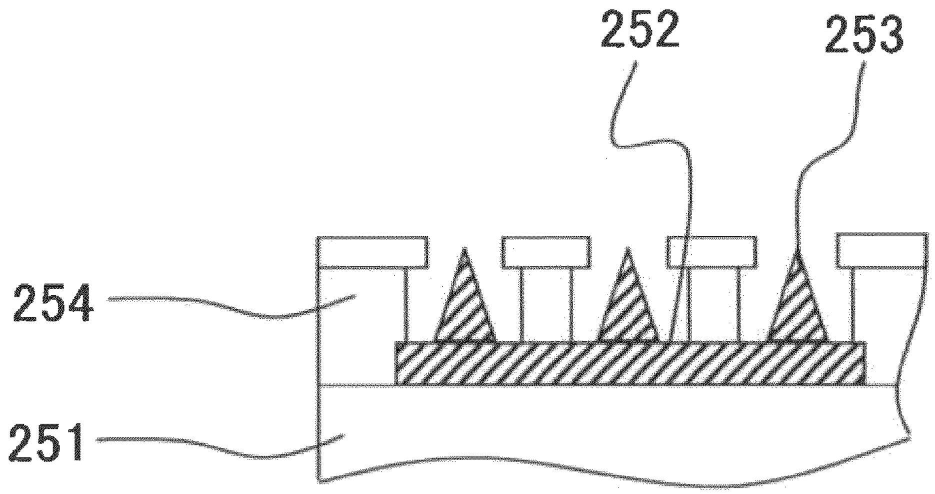

FIGS. 2A and 2B are drawings showing the configuration of the imaging device 200 included in the imaging apparatus of the first embodiment. FIG. 2A is a partial-cross-sectional perspective view showing the schematic configuration of the imaging device 200. FIG. 2B is a cross-sectional view showing a portion of the imaging device 200 in an enlarged view. The imaging device 200 of this embodiment includes a translucent substrate 210, a translucent conductive film 220, a photoelectric conversion film 230, a mesh electrode 240, and a Spindt-type emitter array 250.

The translucent conductive film 220 is formed on the translucent substrate 210. The photoelectric conversion film 230 is formed on the translucent conductive film 220. The Spindt-type emitter array 250 is disposed to face the photoelectric conversion film 230 across vacuum space. The mesh electrode 240 having a plurality of openings is disposed between the photoelectric conversion film 230 and the electron emission array 250.

Although omitted in FIG. 2A for the sake of simplicity of illustration, the imaging device 200 for use in practice includes a mechanism for supporting the electron emission array 250, the photoelectric conversion film 230, and the mesh electrode 240 at predetermined intervals in an opposing manner. The imaging device 200 further includes electrodes for supplying a DC voltage and pulse voltages necessary to drive the imaging device 200. The imaging device 200 moreover includes a vacuum chamber for keeping vacuum space between the electron emission array 250 and the photoelectric conversion film 230.

The imaging device 200 may not be provided with the function to converge electrons emitted from the electron emission array 250 on the photoelectric conversion film 230. In such case, a magnetic field converging system inclusive of a permanent magnet or a solenoid coil may be provided outside the imaging device 200.

The translucent substrate 210 may be made of glass if the imaging device 200 is designed to detect visible light. The translucent substrate 210 maybe made of sapphire or silica glass if the imaging device 200 is designed to detect ultraviolet light. The translucent substrate 210 may be made of beryllium (Be), silicon (Si), aluminum (Al), titanium (Ti), boron nitride (BN), aluminum oxide ($Al_2O_3$), or the like if the translucent substrate 210 is designed to detect X rays. In this manner, proper material may be selected depending on the wavelength of light to be detected.

The translucent conductive film 220 may be configured as a tin oxide ($SnO_2$) film, an ITO film, or a thin metal film such as an aluminum (Al) film, for example. The translucent conductive film 220 is connected to an external circuit 610, which includes a power supply 611 to apply voltage. The external circuit 610 is implemented as part of the signal amplifying and processing circuit 300 and the power supply unit 600 shown in FIG. 1.

A material for forming the photoelectric conversion film 230 may be a semiconductor material such as selenium (Se), silicon (Si), or the like, or may be a compound semiconductor material such as lead oxide (PbO), antimony trisulfide (Sb2S3), cadmium selenide (CdSe), cadmium telluride (CdTe), gallium arsenide (GaAs), zinc telluride (ZnTe), or the like.

Among these materials, a semiconductor material such as selenium (Se) or silicon (Si) may be used to form an amorphous semiconductor film. Application of high voltage to such film causes avalanche amplification of optically generated electric charge in the film, thereby significantly improving sensitivity. The present embodiment will thus be described with respect to a case in which amorphous Se is used as the photoelectric conversion film 230.

It suffices for the mesh electrode 240 to have a plurality of openings. The mesh electrode 240 may be made of a known metal material, alloy material, semiconductor material, or the like. The mesh electrode 240 is connected to a power supply 620. The mesh electrode 240 receives a voltage higher than the voltage applied to the gate electrodes of the electron emission array 250, which will later be described. The power supply 620 is implemented as part of the power supply unit 600 shown in FIG. 1.

The electron emission array 250 is implemented as a matrix array of known electron emission sources such as Spindt-type emitters having cathodes made of a high-melting-point metal, silicon-type emitters having cathodes made of silicon (Si), or electron field emission sources having porous silicon, silicon oxide, or the like placed between electrodes.

Further, there are a variety of methods for driving an electron emission array. The electron emission array 250 may be a passive electron emission array driven by pulse voltages supplied from an external drive circuit, a drive-circuit-embedded passive electron emission array having a drive circuit embedded therein, an active electron emission array having a transistor embedded in each unit area of the array, or a drive-circuit-embedded active electron emission array having a drive circuit embedded therein and also having a transistor embedded in each unit area of the array.

The present embodiment will be described with respect to a case in which a Spindt-type passive emitter array is used as the electron emission array 250. In the following, the term "electron emission array 250" is intended to refer to a Spindt-type passive emitter array 250 unless contrary indication is provided.

If the drive circuit 400 is embedded in the electron emission array 250, the drive circuit 400 shown in FIG. 1 is not used. In this case, the control circuit 500 supplies a clock signal and synchronizing signals to the imaging device 200.

As shown in FIG. 2A, the electron emission array 250 of the present embodiment includes a substrate 251, cathode electrodes 252, cathodes 253, an insulation layer 254, and gate electrodes 255.

The substrate 251 is made of glass, silicon (Si), quartz, ceramics, resin, or the like. The cathode electrodes 252, the insulation layer 254, and the gate electrodes 255 are disposed on the substrate 251 in the order listed.

The cathode electrodes 252 are stripe-shape electrodes having a longitudinal direction thereof extending parallel to the vertical scan direction shown in FIG. 2A. The gate electrodes 255 are stripe-shape electrodes having a longitudinal direction thereof extending parallel to the horizontal scan direction shown in FIG. 2A. In this manner, the cathode electrodes 252 and the gate electrodes 255 extend perpendicularly to each other to form an X-Y matrix An intersecting area defined by a cathode electrode 252 and a gate electrode 255 intersecting with each other is referred to as "unit area", which will be referred to by reference number "256". The unit area 256 corresponds to a pixel of the photoelectric conversion film 230.

A plurality of unit areas 256 included in the stripe-shape area of a given gate electrode 255 are arranged in the horizontal scan direction to form a line that is referred to as a horizontal scan line 257.

In each unit area 256, small holes extend through the gate electrode 255 and the insulation layer 254 to reach the surface of the cathode electrode 252 as shown in FIG. 2B. The cathodes 253 are disposed in these holes to project from the cathode electrodes 252.

The cathodes 253 are made of a high-melting-point metal material such as molybdenum (Mo), niobium (Nb), tungsten (W), or the like. In typical configuration, a plurality of small holes are provided in each unit area 256, and each hole has a single cathode 253 provided therein. FIG. 2A shows a configuration in which 9 small holes are formed in each unit area 256 so that 9 cathodes 253 are provided.

These 9 cathodes 253 constitute a minimum unit of electron emission control provided in each unit area 256, and are referred to as an "element".

The cathode electrodes 252 receive pulse voltages from the horizontal drive circuit 410 to perform a scan in the horizontal direction. The gate electrodes 255 receive pulse voltages from a gate-voltage control circuit of the vertical drive circuit 420 to perform a scan in the vertical direction. This will later be described in detail by referring to FIG. 3.

Although not illustrated in FIGS. 2A and 2B, each unit area 256 may be provided with a convergence electrode on the gate electrode 255 via an insulator to surround the cathodes 253, thereby converging electrons emitted from the cathodes 253 on the photoelectric conversion film 230.

In such imaging device 200, light arriving from above the translucent substrate 210 passes through the translucent substrate 210 and the translucent conductive film 220 to reach the photoelectric conversion film 230. This transmitted light causes electron and hole pairs to be generated in the photoelectric conversion film 230.

When a voltage significantly higher than the voltage applied to the cathodes 253 is applied to the translucent conductive film 220 by the power supply 611 of the external circuit 610, the holes in the photoelectric conversion film 230 move and accelerate in the photoelectric conversion film 230 toward the electron emission array 250 (i.e., move and accelerate in the thickness direction of the photoelectric conversion film 230 toward the electron emission array 250).

When this happens, the holes collide with atoms constituting the photoelectric conversion film 230 one after another, thereby causing avalanche amplification to generate new electron and hole pairs.

Holes generated by such avalanche amplification are accumulated in the photoelectric conversion film 230 on the side closer to the electron emission array 250.

Figure 3:
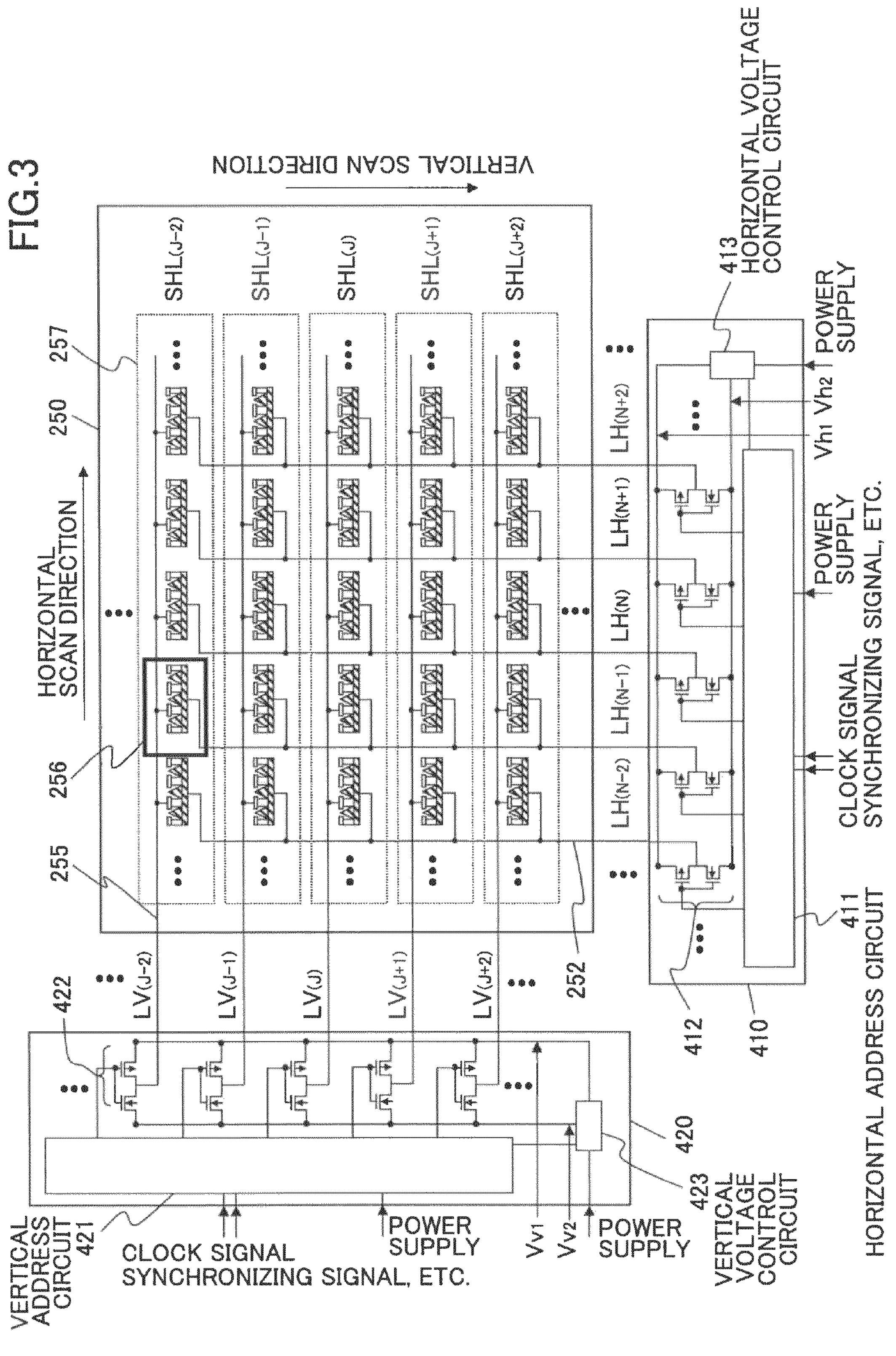
FIG. 3 is a schematic plan view of a drive system of the electron emission array included in the imaging apparatus according to the first embodiment.

The electron emission array 250 receives pulse voltages from the drive circuit 400. FIG. 3 is a schematic plan view of a drive system of the electron emission array 250 included in the imaging apparatus according to the first embodiment.

In the following, the cathode electrodes 252 may sometimes be referred to as cathode electrodes LH for the sake of convenience of explanation which will later be given with respect to pulse voltages applied to the electron emission array 250. The cathode electrodes LH are arranged in the horizontal scan direction. In FIG. 3, cathode electrodes LH(N−2) through LH(N+2) are shown instead of showing all the cathode electrodes LH. N is any integer number.

By the same token, the gate electrodes 255 may sometimes be referred to as gate electrodes LV. The gate electrodes LV are arranged in the vertical scan direction of the imaging device 200. In FIG. 3, gate electrodes LV(J−2) through LV(J+2) are shown instead of showing all the gate electrodes LV. J is any integer number.

By the same token, the horizontal scan line 257 may sometimes be referred to as a horizontal scan line SHL. Horizontal scan lines SHL are provided as many as there are gate electrodes LV in the vertical scan direction. In FIG. 3, horizontal scan lines SHL(J−2) through SHL(J+2) are shown instead of showing all the horizontal scan lines SHL. J is any integer number.

As shown in FIG. 3, the electron emission array 250 is connected to the horizontal drive circuit 410 and the vertical drive circuit 420 for performing scans in the horizontal direction and in the vertical direction.

The horizontal drive circuit 410 includes a horizontal address circuit 411, horizontal buffer circuits 412, and a horizontal voltage control circuit 413.

The horizontal address circuit 411 receives electric power from the power supply unit 600 shown in FIG. 1. The horizontal address circuit 411 also receives a clock signal and synchronizing signals supplied from the control circuit 500 to select and drive one of the horizontal buffer circuits 412 provided for the respective cathode electrodes LH.

The horizontal buffer circuit 412 includes a pair of transistors driven by the horizontal address circuit 411. The horizontal buffer circuit 412 supplies pulse voltages to a cathode electrode LH selected by the horizontal address circuit 411.

The horizontal voltage control circuit 413 is controlled by the horizontal address circuit 411. The horizontal voltage control circuit 413 controls the pulse voltages supplied to the cathode electrodes LH via the horizontal buffer circuits 412.

In such horizontal drive circuit 410, the pulse voltages generated and output from the horizontal address circuit 411 drive and control the horizontal buffer circuits 412. Through the driving of the horizontal buffer circuit 412, the pulse voltages (amplitude: Vh1−Vh2) comprised of voltages Vh1 and Vh2 (Vh1>Vh2) supplied from the horizontal voltage control circuit 413 are supplied to the cathode electrodes LH. In this manner, a scan in the horizontal direction is performed by applying pulse voltages from the horizontal drive circuit 410 to the cathode electrodes LH.

The vertical drive circuit 420 includes a vertical address circuit 421, vertical buffer circuits 422, and a vertical voltage control circuit 423.

The vertical drive circuit 420 has the same configuration as the horizontal drive circuit 410, except that the vertical drive circuit 420 is connected to the gate electrodes LV of the electron emission array 250 to supply pulse voltages to the gate electrodes LV. The function and operation of the vertical address circuit 421, the vertical buffer circuits 422, and the vertical voltage control circuit 423 are also the same as those of the horizontal address circuit 411, the horizontal buffer circuits 412, and the horizontal voltage control circuit 413, except that the gate electrodes LV are subjected to scan.

In such vertical drive circuit 420, the pulse voltages generated and output from the vertical address circuit 421 drive and control the vertical buffer circuits 422. Through the driving of the vertical buffer circuits 422, pulse voltages (amplitude: Vv1−Vv2) comprised of voltages Vv1 and Vv2 (Vv1>Vv2) supplied from the vertical voltage control circuit 423 are supplied to the gate electrodes LV. In this manner, a scan in the vertical direction is performed by applying pulse voltages from the vertical drive circuit 420 to the gate electrodes LV.

In the configuration shown in FIG. 3, one of the cathode electrodes LH is successively selected to receive pulse voltages, thereby performing a scan in the horizontal direction by use of the cathode electrodes LH, and one of the gate electrodes LV is successively selected to receive pulse voltages, thereby performing a scan in the vertical direction by use of the gate electrodes LV. Conversely, provision may be made such that a scan in the vertical direction is performed by use of the cathode electrodes LH, and a scan in the horizontal direction is performed by use of the gate electrodes LV.

Figure 4:
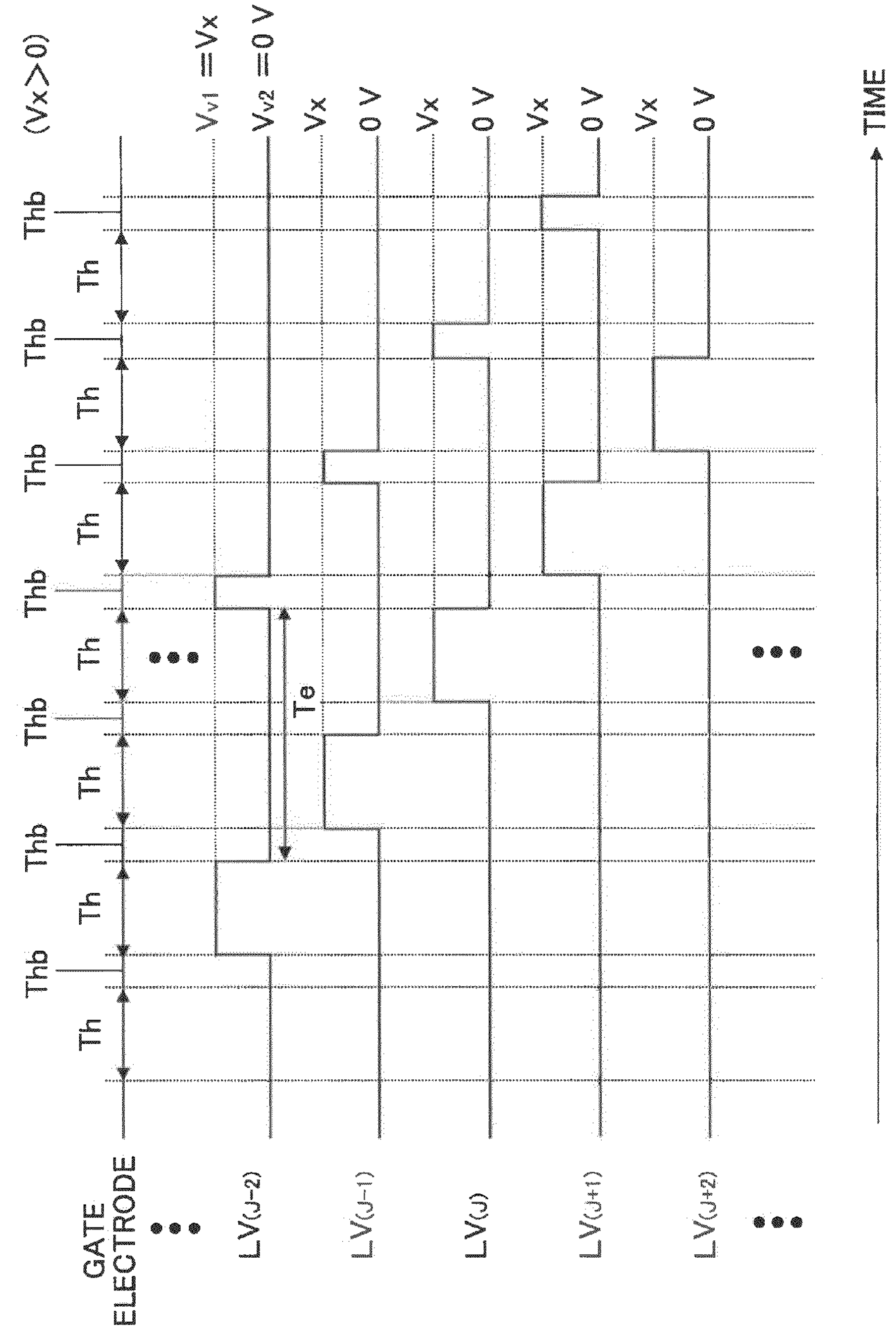
FIG. 4 is a drawing showing the amplitude and timing of pulse voltages applied to the gate electrodes LV of the electron emission array in the imaging apparatus having the drive system shown in FIG. 3.

FIG. 4 is a drawing showing the amplitude and timing of pulse voltages applied to the gate electrodes LV of the electron emission array 250 in the imaging apparatus having the drive system shown in FIG. 3.

In FIG. 4, the voltages Vv1 and Vv2 of the pulse voltages supplied from the vertical voltage control circuit 423 to the gate electrodes LV of the electron emission array 250 are selected such that Vv1 is Vx (Vx>0 V), and Vv2 is the ground potential (0 V).

Figure 5:
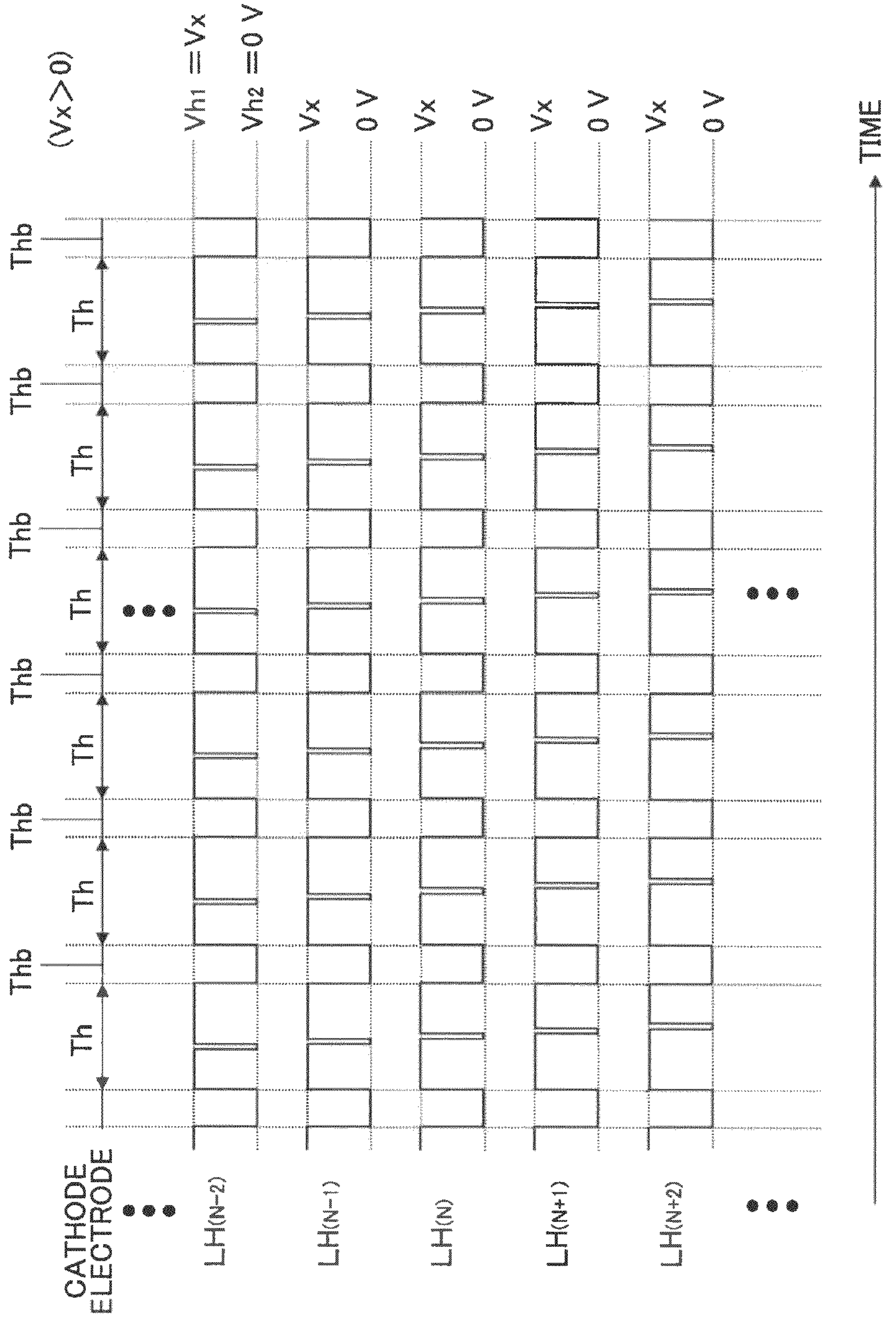
FIG. 5 is a drawing showing the amplitude and timing of pulse voltages applied to the cathode electrodes LH of the electron emission array in the imaging apparatus having the drive system shown in FIG. 3.

FIG. 5 is a drawing showing the amplitude and timing of pulse voltages applied to the cathode electrodes LH of the electron emission array 250 in the imaging apparatus having the drive system shown in FIG. 3.

In FIG. 5, the voltages Vh1 and Vh2 of the pulse voltages supplied from the horizontal voltage control circuit 413 to the cathode electrodes LH of the electron emission array 250 are selected such that Vh1 is Vx (Vx>0 V), and Vh2 is the ground potential (0 V).

In FIG. 4 and FIG. 5, Th represents a video signal output period in a horizontal scan, and Thb represents a horizontal blanking period.

When the pulse voltages shown in FIG. 4 and FIG. 5 are applied to the electron emission array 250, electrons are emitted from the cathodes 253 that are included in the unit area 256 situated at the intersection between a gate electrode LV receiving the voltage Vx and a cathode electrode LH receiving voltage 0 V, i.e., emitted from the element situated at the intersection between a gate electrode LV receiving the voltage Vx and a cathode electrode LH receiving voltage 0 V.

In the video signal output period Th in a horizontal scan, thus, electrons are successively emitted from the elements included in a single horizontal scan line 257 shown in FIG. 3. This operation is successively repeated for each of the horizontal scan lines 257, thereby providing scans in the horizontal direction and vertical direction of the electron emission array 250.

Electrons successively emitted from the elements of the electron emission array 250 shown in FIG. 2 in the video signal output period Th of a horizontal scan are pulled out toward the photoelectric conversion film 230 by the mesh electrode 240 receiving a voltage higher than the voltage (Vx) applied to the gate electrodes 255. When the electrons emitted from a given element reach the photoelectric conversion film 230, these electrons define a spot size on the photoelectric conversion film 230. An area corresponding to this spot size is referred to as a "pixel".

When electrons emitted from the electron emission array 250 and holes accumulated in the photoelectric conversion film 230 are coupled with each other, an electric current flows through the external circuit 610 via the translucent conductive film 220. This electric current is detected as an output signal, which is amplified and processed by the signal amplifying and processing circuit 300 to produce a video signal responsive to an incident light image.

As shown in FIG. 4, each gate electrode LV receives the applied voltage Vx in the horizontal blanking period Thb starting upon the passage of a time Te (=2×(Th+Thb)) immediately following the video signal output period Th, during which the voltage Vx is applied to produce a video signal. Here, the horizontal blanking period Thb comes immediately following the second video signal output period Th appearing after the video signal output period Th during which the corresponding voltage Vx is applied.

Further, all the cathode electrodes LH receive 0 V in each horizontal blanking period Thb as shown in FIG. 5.

As a result, the cathodes 253 of all the unit areas 256 included in a given horizontal scan line 257 emit electrons in the horizontal blanking period Thb upon the passage of time Te (=2×(Th+Thb)) immediately following the outputting of a video signal. These electrons serve to remove the residual holes and generated and accumulated holes existing in the photoelectric conversion film 230 at the position opposite these unit areas 256. Here, the term "residual holes and generated and accumulated holes" refer to the holes that remain in the photoelectric conversion film 230 without being read at the time of outputting a video signal as well as the holes that are generated and accumulated in the photoelectric conversion film 230 in response to incident light after the outputting of the video signal.

Namely, during the horizontal blanking period Thb immediately following the video signal output period Th for outputting a video signal in a given horizontal scan line 257 (e.g., SHL(J)), electrons are emitted from all the elements included in the second preceding horizontal scan line (i.e., SHL(J−2) preceding the previous line SHL(J−1)) relative to the given horizontal scan line SHL(J). With this arrangement, the residual holes and generated and accumulated holes in the photoelectric conversion film 230 are removed.

Figure 6:
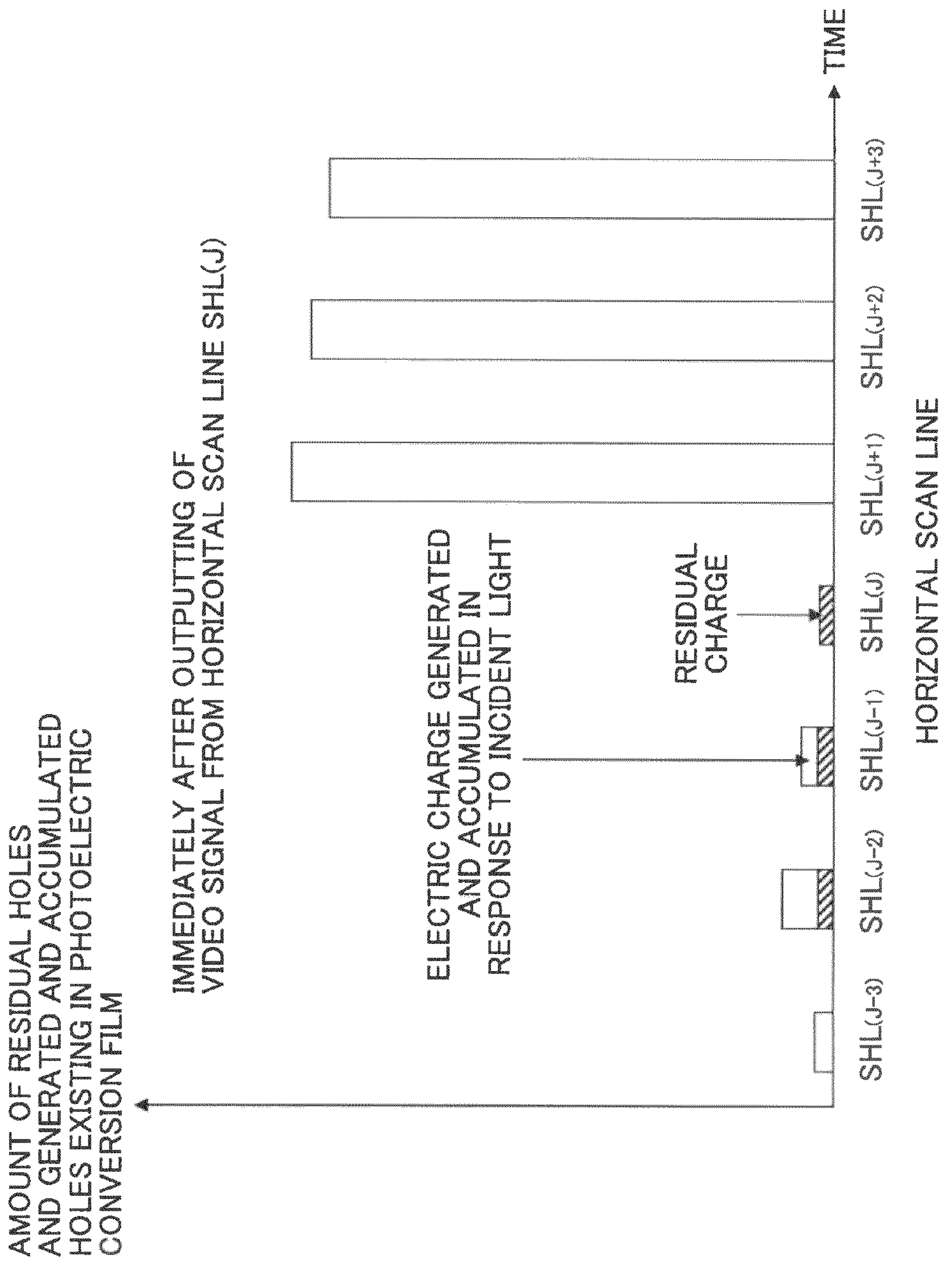
FIG. 6 is an illustrative drawing showing the amount of electric charge (holes) existing in a photoelectric conversion film at the position opposite to some consecutive horizontal scan lines in the imaging device of the imaging apparatus according to the first embodiment.

FIG. 6 is an illustrative drawing showing the amount of electric charge (holes) existing in the photoelectric conversion film 230 at the position opposite to the consecutive horizontal scan lines SHL(J−3) through SHL(J+3) in the imaging device of the imaging apparatus according to the present embodiment.

FIG. 6 shows the amount of residual holes and generated and accumulated holes existing in the photoelectric conversion film 230 at the positions corresponding to horizontal scan lines SHL situated in the vicinity of the horizontal scan line SHL(J) as exist immediately after the outputting of a video signal from the horizontal scan line SHL(J) while a constant amount of light enters the photoelectric conversion film 230. In FIG. 6, the amount of electric charge generated and accumulated by incident light is indicated by a white (non-hatched) bar, and the amount of residual electric charge after the outputting of video signal is indicated by a hatched bar.

In the present embodiment, during the horizontal blanking period Thb immediately following the outputting of a video signal from the horizontal scan line SHL(J) shown in FIG. 6, electrons are emitted from all the elements included in the second preceding horizontal scan line SHL(J−2) relative to this horizontal scan line SHL(J). These electrons serve to remove the residual holes and generated and accumulated holes in the photoelectric conversion film 230 at the opposite position.

As shown in FIG. 6, the portion of the photoelectric conversion film 230 corresponding to the horizontal scan line SHL(J−2) is sufficiently spaced apart from the portion of the photoelectric conversion film 230 corresponding to the horizontal scan line SHL(J+1) at which the potential is high due to a large amount of accumulated holes. Further, the portions of the photoelectric conversion film 230 corresponding to the horizontal scan lines SHL(J−1) and SHL(J) at which the potentials are significantly lower are provided between the portion of the photoelectric conversion film 230 corresponding to the horizontal scan line SHL(J−2) and the portion of the photoelectric conversion film 230 corresponding to the horizontal scan line SHL(J+1). Accordingly, electrons emitted from all the elements included in the horizontal scan line SHL(J−2) in the horizontal blanking period Thb travel straight toward the opposite portion of the photoelectric conversion film 230 without experiencing vending, thereby removing the residual holes and generated and accumulated holes existing at such opposite position.

With this arrangement, it is possible to remove the residual and generated and accumulated holes existing in the photoelectric conversion film 230 during the horizontal blanking period Thb thereby to prevent the occurrence of a residual image while avoiding the lowering of sensitivity and the occurrence of pixel sensitivity variation resulting from vending.

Further, the holes that are generated and accumulated by incident light from the outputting of a video signal to the horizontal blanking period Thb occurring after the passage of time Te are also removed in the portion of the photoelectric conversion film 230 corresponding to each horizontal scan line 257. Accordingly, effective charge accumulation time is shortened in the photoelectric conversion film 230, which achieves the operation of an electronic shutter.

In the examples shown in FIG. 4 and FIG. 5, electrons are emitted from all the elements included in the horizontal scan line 257 during the horizontal blanking period Thb occurring upon the passage of Te (=2×(Th+Thb)) immediately following the video signal output period Th during which a video signal is output. This horizontal blanking period Thb for electron generation may be any horizontal blanking period Thb excluding the horizontal blanking periods Thb immediately preceding and immediately following the video signal output period Th during which a video signal is output.

When the time lapse Te from the video signal output period Th for outputting video signal to the emission of electrons is prolonged, the effect of an electronic shutter is improved, thereby further improving time resolution.

Moreover, under the lighting condition in which light is driven by a frequency lower than the field frequency or frame frequency of the imaging apparatus, the time Te may be adjusted such that the effective field frequency or effective frame frequency of the imaging apparatus becomes equal to the frequency of the light. Such arrangement can suppress the occurrence of flickers in output images.

The drive method described above removes, during the horizontal blanking period Thb, the holes generated and accumulated in the photoelectric conversion film 230 in response to incident light. The effective sensitivity thus drops. Such sensitivity drop can easily be compensated for by improving the amplification factor of avalanche amplification by increasing the voltage applied from the power supply 611 of FIG. 2 to the translucent conductive film 220 to increase an electric field inside the photoelectric conversion film 230.

The above-described embodiment has been directed to a configuration in which a voltage equal to the voltage Vx for video signal output is applied to the gate electrode 255 during the entirety of each horizontal blanking period Thb as shown in FIG. 4. In order to control the amount of electrons emitted in the horizontal blanking period Thb, the voltage Vx may be applied to the gate electrode 255 only during a partial period of each horizontal blanking period Thb.

The voltage Vx may be intermittently applied (as pulses) to the gate electrodes 255 during the horizontal blanking period Thb.

With such arrangement, it is possible to remove a residual image and to achieve an electronic-shutter operation while reducing the load on the electron emission array 250.

Instead of or in addition to changing the time length during which the voltage Vx is applied to the gate electrodes 255 in the horizontal blanking period Thb, a voltage applied to the gate electrodes 255 in the horizontal blanking period Thb may be set lower or higher than the voltage Vx for video signal output, thereby controlling the amount of electrons emitted in the horizontal blanking period Thb.

The voltage applied to the gate electrodes 255 in the horizontal blanking period Thb may be set higher than the voltage Vx for video signal output. Such arrangement can significantly increase the electric current density of electrons emitted from elements in the horizontal blanking period Thb, compared with the electric current density of electrons emitted at the time of video signal output.

It is thus possible to remove a residual image and to achieve an electronic-shutter operation with increased reliability even when highly bright light enters the photoelectric conversion film 230.

The above-described embodiment has been directed to an example in which a voltage equal to voltage 0 V for video signal output is applied to the cathode electrodes 252 during the entirety of each horizontal blanking period Thb as shown in FIG. 5. In order to control the amount of electrons emitted in the horizontal blanking period Thb, voltage 0 V may be applied to the cathode electrodes 252 only during a partial period of each horizontal blanking period Thb.

Voltage 0 V may be intermittently applied (as pulses) to the cathode electrodes 252 during the horizontal blanking period Thb.

With such arrangement, it is possible to remove a residual image and to achieve an electronic-shutter operation while reducing the load on the electron emission array 250 and ensuring increased reliability and increased product life.

Moreover, the above-described embodiment has been directed to a configuration in which all the elements included in a given horizontal scan line 257 emit electrons in the horizontal blanking period Thb upon the passage of time Te (=2×(Th+Thb)) immediately following the video signal output period Th for video signal output, thereby removing the residual holes and generated and accumulated holes existing in the photoelectric conversion film 230 at the opposite positions. Alternatively, provision may be made such that electrons are emitted in a plurality of horizontal blanking periods Thb. For example, all the elements included in a given horizontal scan line 257 may emit electrons in the horizontal blanking period Thb upon the passage of time Te (=2×(Th+Thb)) immediately following the video signal output period Th, and may also emit electrons in a horizontal blanking period Thb next following the above-noted horizontal blanking period Thb, thereby removing the residual holes and generated and accumulated holes existing in the photoelectric conversion film 230 at the opposite positions.

Namely, during the horizontal blanking period Thb immediately following the video signal output period Th for outputting a video signal in a given horizontal scan line 257 (e.g., SHL(J+1)), electrons are emitted from all the elements included in the second and third preceding horizontal scan lines (i.e., SHL(J−1) and SHL(J−2)) relative to the given horizontal scan line SHL(J+1). With this arrangement, the residual holes and generated and accumulated holes in the photoelectric conversion film 230 are removed.

It is thus possible to remove a residual image and to achieve an electronic-shutter operation even when highly bright light enters the photoelectric conversion film 230.

In the embodiment described above, interlace scan may be employed. Fields are classified into odd-number fields and even-number fields. While pulse voltages identical to those of the above-described embodiment shown in FIG. 5 are applied to the cathode electrodes 252, pulse voltages shown in FIG. 7 may be applied to the gate electrodes 255 in the odd-number fields, and pulse voltages shown in FIG. 8 may be applied to the gate electrodes 255 in the even-number fields. This makes it possible to add up two video signals from two adjacent horizontal scan lines 257 for simultaneous reading. In this manner, the removal of residual images and the attainment of electronic-shutter operation are made possible even with respect to an interlace scan in which a combination of two adjacent horizontal scan lines 257 is changed between the odd-number fields and the even-number fields.

Figure 7:
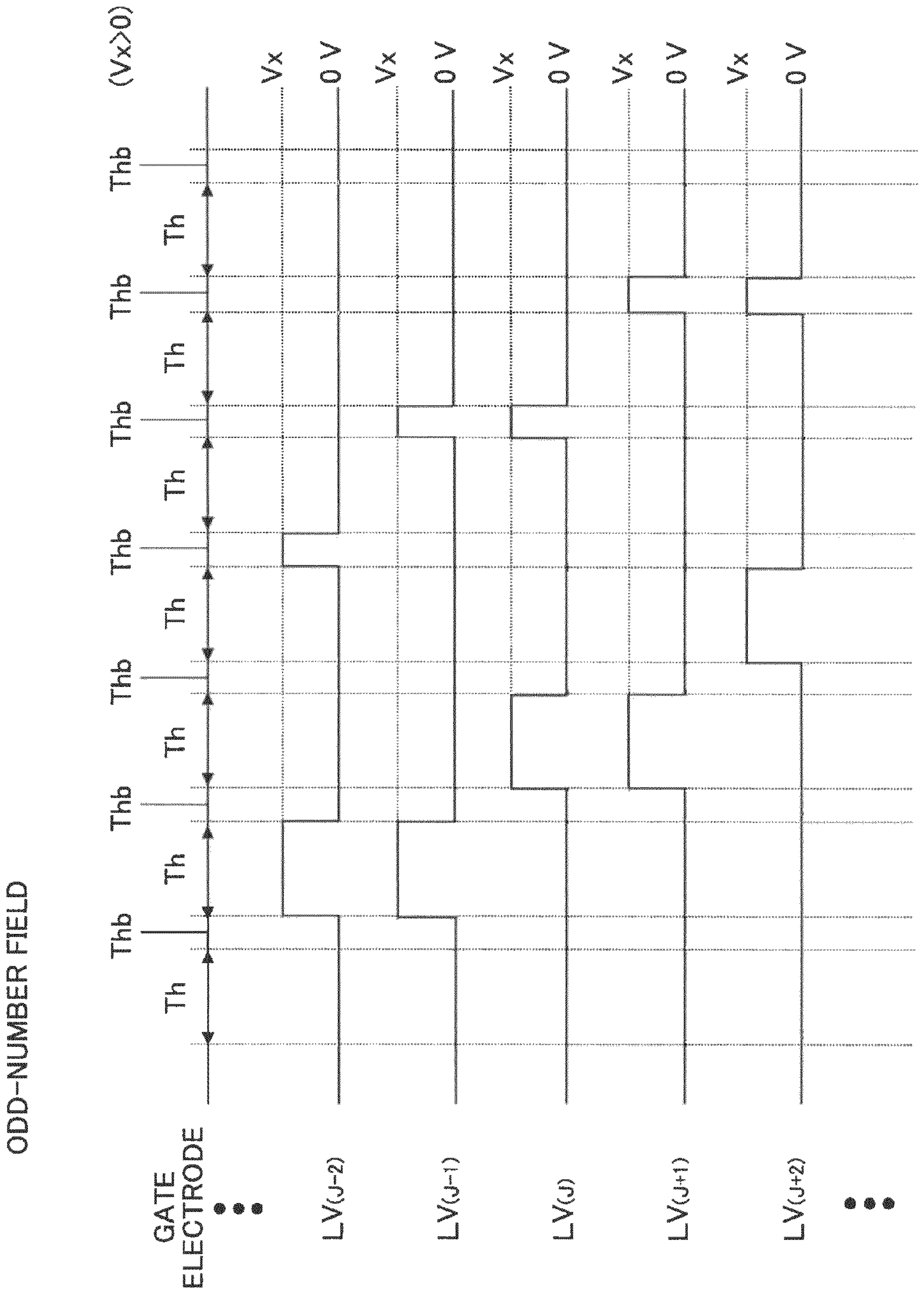
FIG. 7 is a drawing showing the amplitude and timing of pulse voltages applied to the gate electrodes LV in odd-number fields in the imaging apparatus of the first embodiment.
Figure 8:
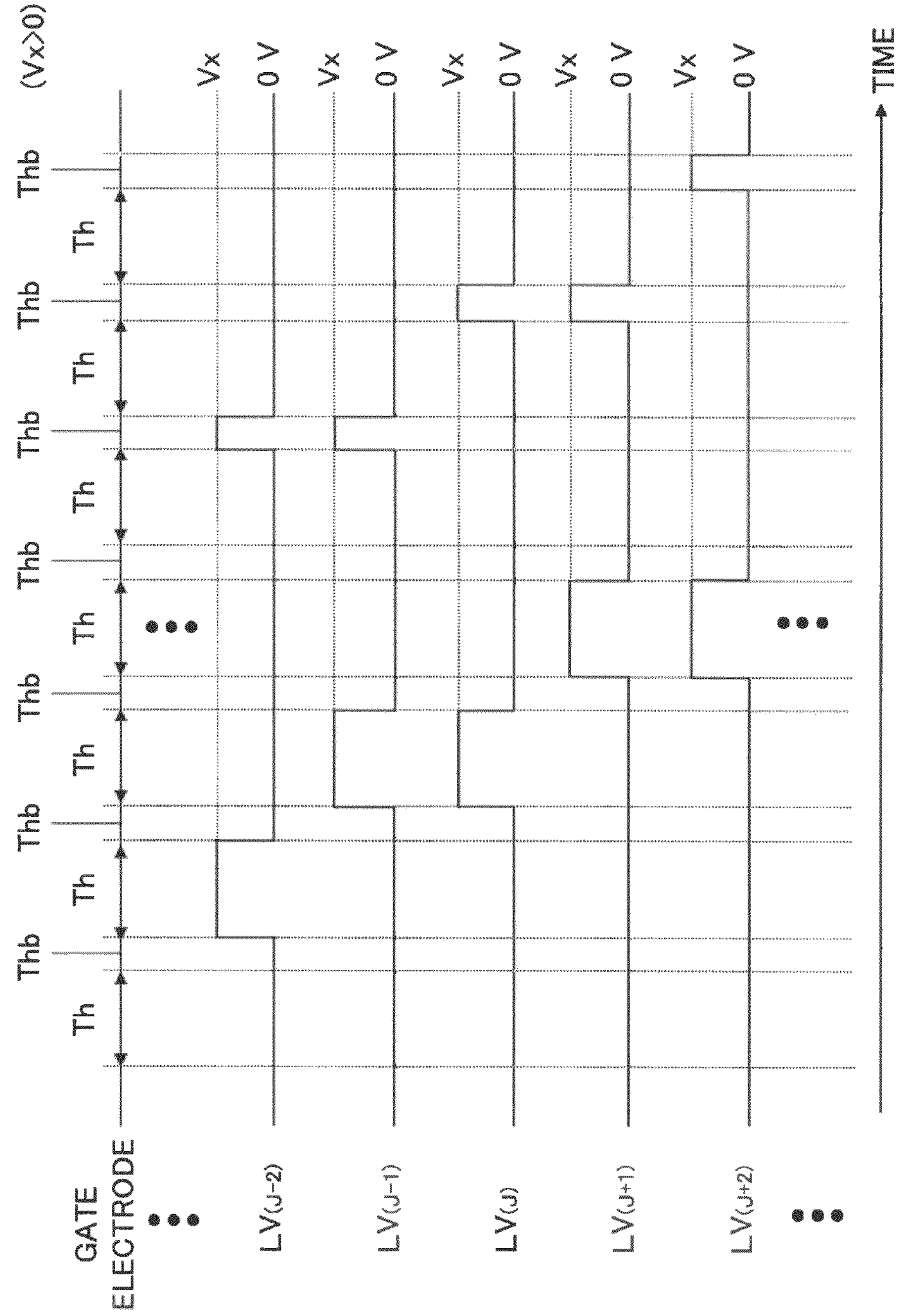
FIG. 8 is a drawing showing the amplitude and timing of pulse voltages applied to the gate electrodes LV in even-number fields in the imaging apparatus of the first embodiment.

In the above-described operation, as shown in FIG. 7 for the odd-number fields, the timing at which Vx is applied in the horizontal blanking period Thb differs by a shift length equal to the video signal output period Th between the two gate electrodes 255 to which the voltage Vx is simultaneously applied during the video signal output period Th.

This serves to provide equal accumulation time for the respective portions of the photoelectric conversion film 230 corresponding to the two horizontal scan lines 257 whose video signals are added for output in the even-number fields.

Similar operations may be performed with respect to the even-number fields to achieve an interlace scan that produces an output made by adding up video signals having equal accumulation time. This can be achieved while preventing the occurrence of residual images and providing an electronic-shutter operation.

Second Embodiment

Figure 9:
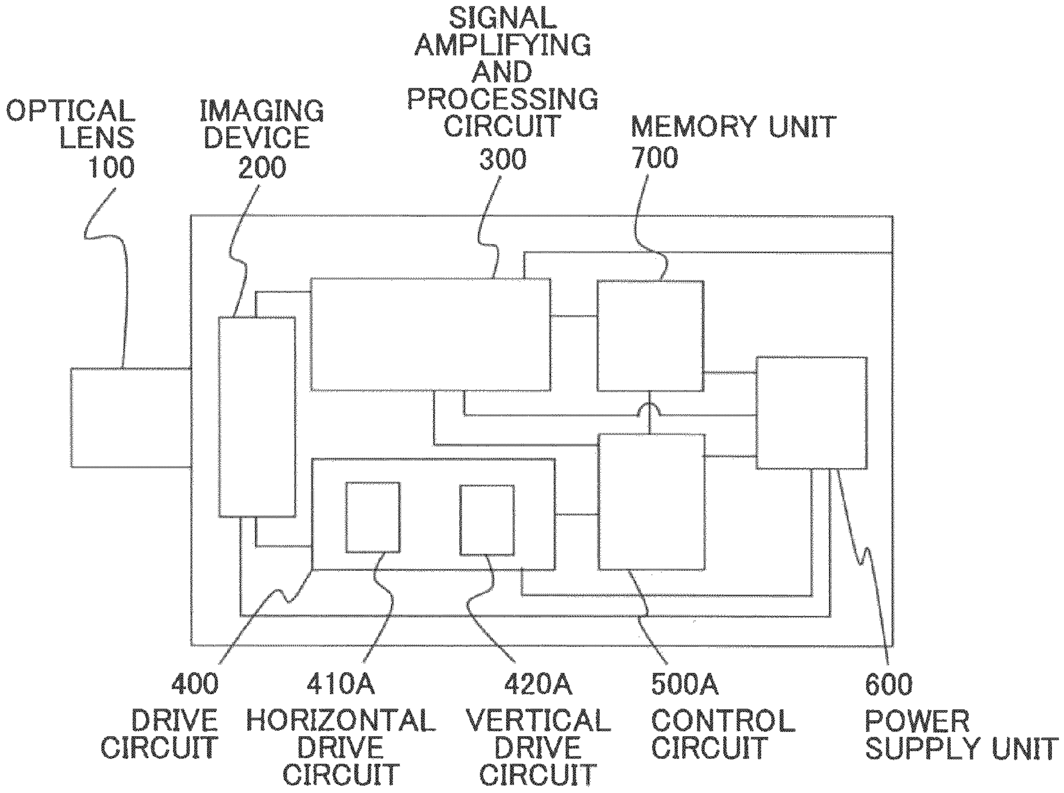
FIG. 9 is a schematic cross-sectional view of an imaging apparatus according to a second embodiment.

FIG. 9 is a schematic cross-sectional view of an imaging apparatus according to a second embodiment. The imaging apparatus of the present embodiment differs from the imaging apparatus of the first embodiment in that a memory unit 700 is provided. Due to the provision of the memory unit 700, the configuration and operation of the imaging device 200 also differ from those of the first embodiment. In the following, a description will be given mainly with respect to such differences. The same elements as those of the imaging apparatus of the first embodiment are referred to by the same numerals, and a description thereof will be omitted.

The memory unit 700 serves to record and store video signals output from the signal amplifying and processing circuit 300. The memory unit 700 may be implemented by use of a known volatile or nonvolatile memory.

A control circuit 500A reads a video signal that is recorded and stored in the memory unit 700. The control circuit 500A generates electron-emission-array control signals based on the signal level (hereinafter referred to as "amplitude") of this video signal for provision to the drive circuit 400.

The drive circuit 400 includes a horizontal drive circuit 410A, a vertical drive circuit 420A, etc., and generates pulse voltages necessary to drive the imaging device 200 based on the clock signal, synchronizing signals, electron-emission-array control signals, and the like supplied from the control circuit 500A.

The configuration shown in FIG. 9 is directed to an example in which the memory unit 700 is used to record and store video signals. Alternatively, a known video delay circuit may be used in place of the memory unit 700.

Figure 10:
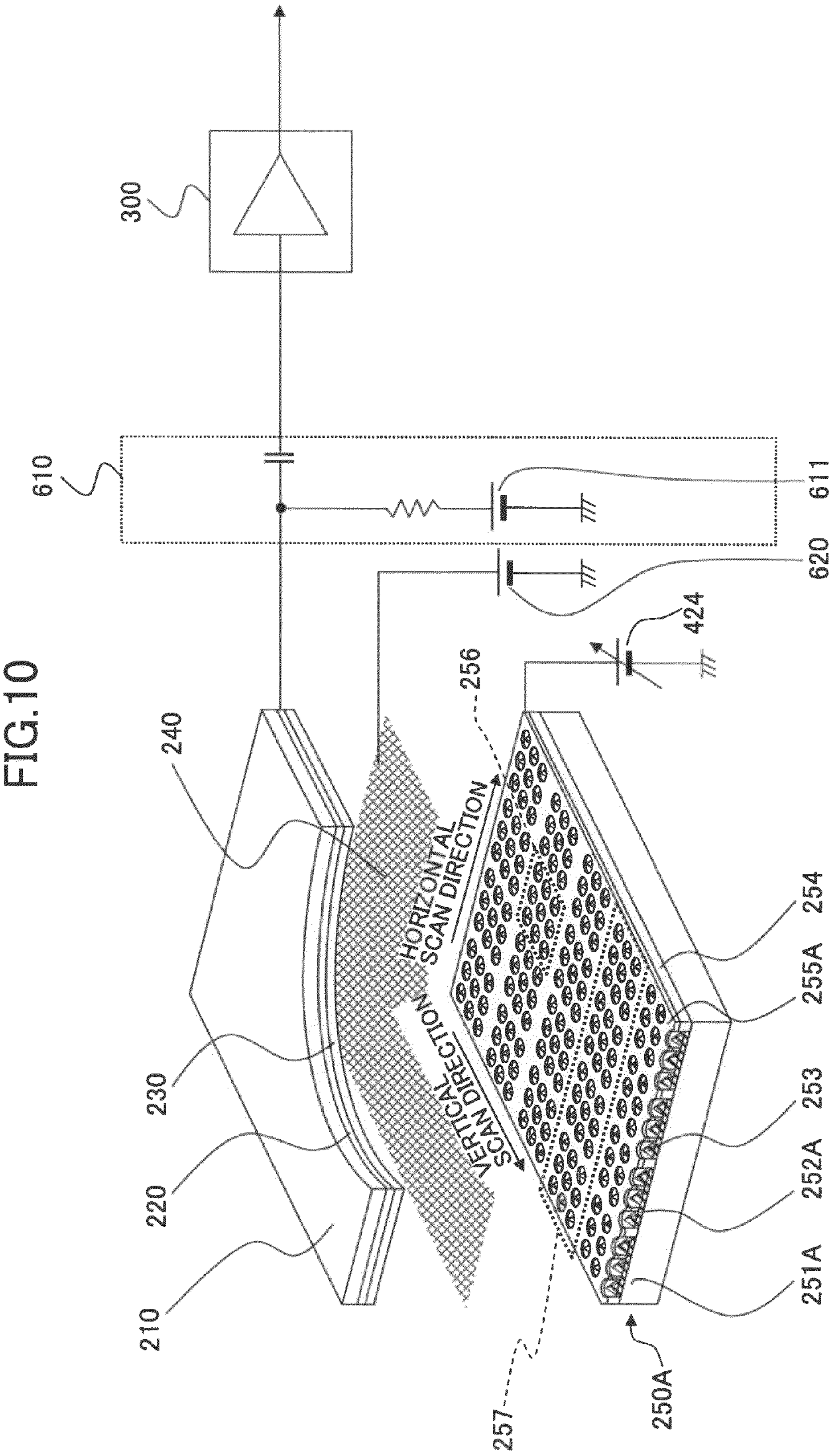
FIG. 10 is a partial-cross-sectional perspective view showing the configuration of an imaging device included in the imaging apparatus according to the second embodiment.
Figure 11:
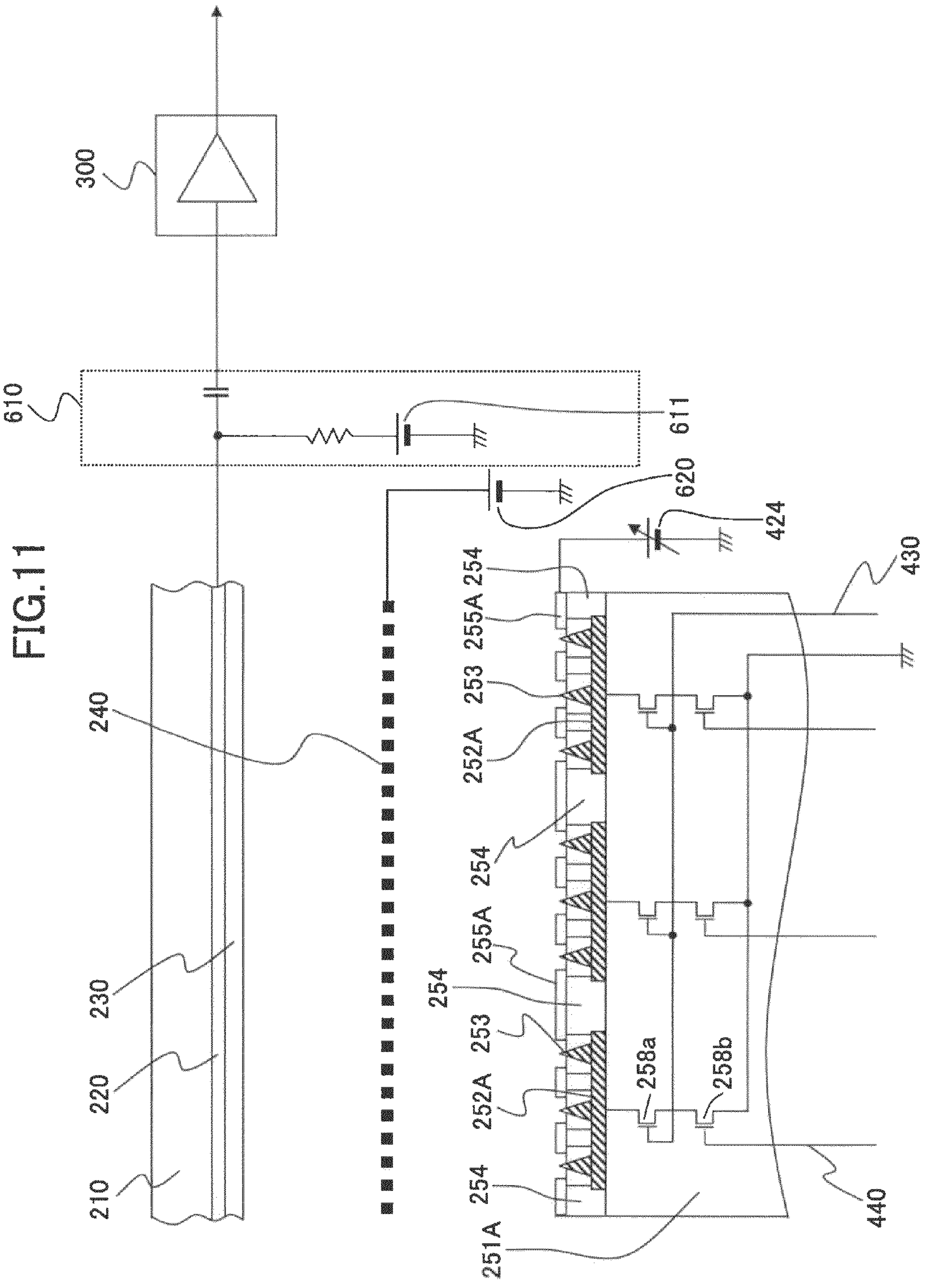
FIG. 11 is a schematic drawing showing the configuration of a main part of the imaging device included in the imaging apparatus according to the second embodiment.

FIG. 10 is a partial-cross-sectional perspective view showing the configuration of the imaging device 200 included in an imaging apparatus according to the second embodiment. FIG. 11 is a schematic drawing showing the configuration of a main part of the imaging device 200 included in the imaging apparatus according to the second embodiment.

The electron emission array of the imaging device 200 used in the present embodiment is a Spindt-type active electron emission array 250A, which is driven by pulse voltages and the like supplied from the drive circuit 400 externally provided, and which has transistors 258*a* and 258*b* embedded in the portion of a substrate 251A corresponding to each unit area 256.

There are a variety of methods for driving an electron emission array. The electron emission array 250A may be a passive electron emission array driven by pulse voltages supplied from an external drive circuit, a drive-circuit-embedded passive electron emission array having a drive circuit embedded therein, an active electron emission array having a transistor embedded in each unit area of the array, or a drive-circuit-embedded active electron emission array having a drive circuit embedded therein and also having a transistor embedded in each unit area of the array.

Further, there are a variety of electron emission arrays. The electron emission array 250 may be implemented as a matrix array of known electron emission sources such as Spindt-type emitters having cathodes made of a high-melting-point metal, silicon-type emitters having cathodes made of silicon (Si), or electron field emission sources having porous silicon, silicon oxide, or the like placed between electrodes.

The present embodiment will be described with respect to a case in which a Spindt-type active emitter array is used as the electron emission array 250A. The electron emission array 250A is basically the same as the electron emission array 250 of the first embodiment, except that the substrate 251A, unit-area-specific cathode electrodes 252, and gate electrode 255A have different configurations. In the following, the term "electron emission array 250A" is intended to refer to a Spindt-type active emitter array 250A unless contrary indication is provided.

The substrate 251A of the electron emission array 250A is made of a known semiconductor such as silicon (Si), gallium arsenide (GaAs), or the like, and includes an X-Y matrix array inclusive of transistors 258*a* and 258*b* corresponding to the respective unit areas 256.

The unit-area-specific cathode electrodes 252A formed on the substrate 251A are insulated from each other and spaced apart at predetermined intervals from adjacent unit-area-specific cathode electrodes. The unit-area-specific cathode electrodes 252A are electrically coupled to the transistors 258*a*.

In the present embodiment, an area defined by a unit-area-specific cathode electrode 252A is referred to as the unit area 256. In each unit area 256, small holes extend through the gate electrode 255A and the insulation layer 254 to reach the surface of the unit-area-specific cathode electrode 252A. The cathodes 253 are disposed in these holes to project from the unit-area-specific cathode electrode 252A. The electron emission sources constituting a minimum unit of electron emission control provided in each unit area 256 are referred to as an "element".

The gate electrode 255A is shared by all the pixels 256.

Figure 12:
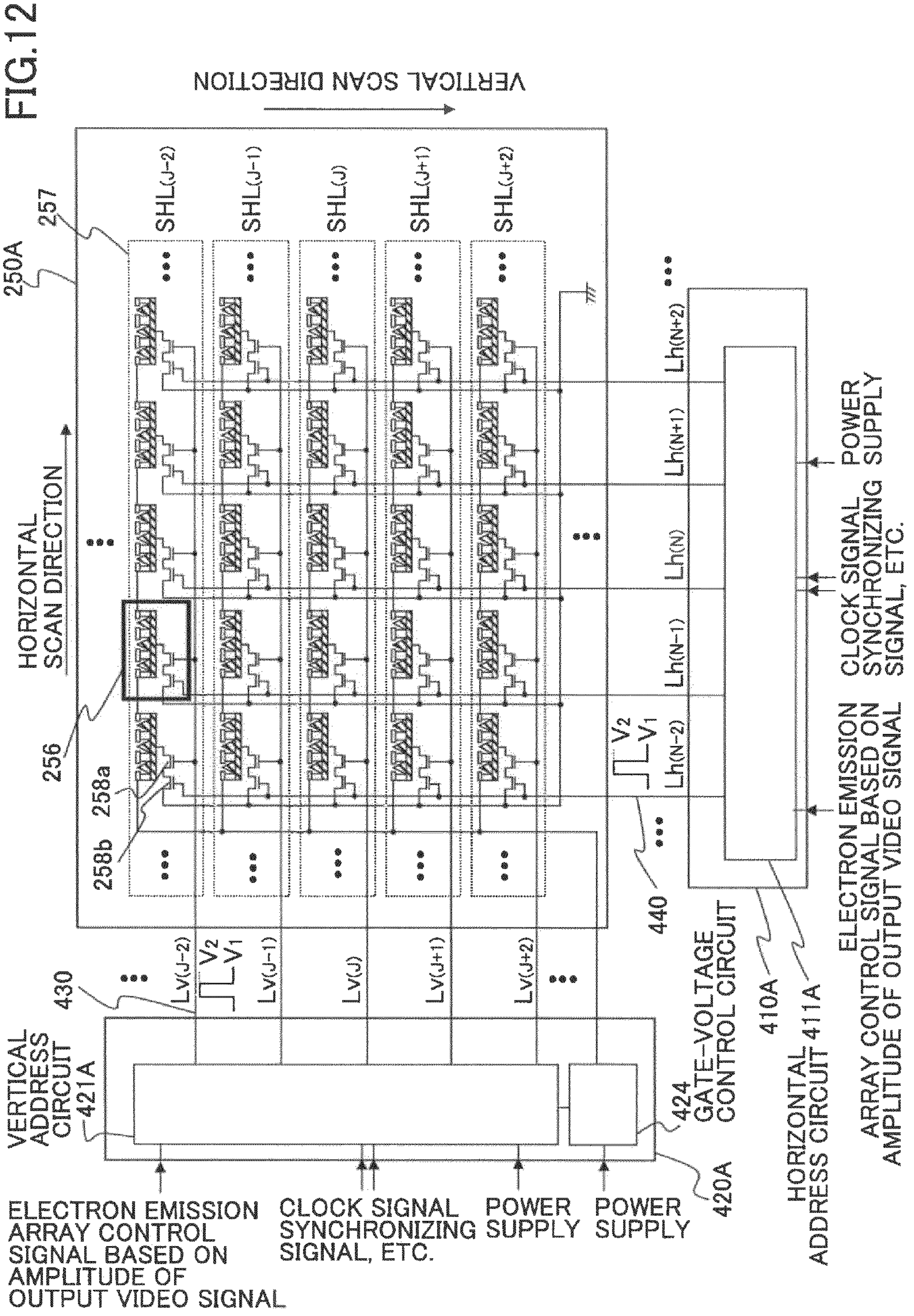
FIG. 12 is a schematic plan view of a drive system of the electron emission array included in the imaging apparatus according to the second embodiment.

FIG. 12 is a schematic plan view of a drive system of the electron emission array 250A included in the imaging apparatus according to the present embodiment.

In the following, a vertical scan control line 430 may sometimes be referred to as a vertical scan control line Lv for the sake of convenience of explanation which will later be given with respect to pulse voltages applied to the electron emission array 430A. The vertical scan control lines Lv are arranged in the vertical scan direction of the imaging device 200. In FIG. 12, vertical scan control lines Lv(J−2) through Lv(J+2) are shown instead of showing all the vertical scan control lines Lv. J is any integer number.

By the same token, a horizontal scan control line 440 may sometimes be referred to as a horizontal scan control line Lh. The horizontal scan control lines Lh are arranged in the horizontal scan direction. In FIG. 12, horizontal scan control lines Lh(N−2) through Lh(N+2) are shown instead of showing all the horizontal scan control lines Lh. N is any integer number.

By the same token, the horizontal scan line 257 may sometimes be referred to as a horizontal scan line SHL. Horizontal scan lines SHL are provided as many as there are vertical scan control lines Lv in the vertical scan direction. In FIG. 12, horizontal scan lines SHL(J−2) through SHL(J+2) are shown instead of showing all the horizontal scan lines SHL. J is any integer number.

A vertical-direction scan for the electron emission array 250A is performed by applying pulse voltages comprised of voltages V1 and V2 (V2>V1) to the vertical scan control lines Lv from the vertical address circuit 421A of the vertical drive circuit 420A to control the transistor 258*a* in each unit area 256. As the voltage V2 is applied to a vertical scan control line 430, the transistors 258*a* become conductive.

A horizontal-direction scan for the electron emission array 250A is performed by applying pulse voltages comprised of voltages V1 and V2 (V2>V1) to the horizontal scan control lines Lh from the horizontal address circuit 411A of the horizontal drive circuit 410A to control the transistor 258*b* in each unit area 258. As the voltage V2 is applied to a horizontal scan control line 440, the transistors 258*b* become conductive.

The transistor 258*b* of each pixel 256 is coupled to the ground (i.e., connected to 0 V). When both of the transistors 258*a* and 258*b* are turned on, voltage 0 V is applied to the unit-area-specific cathode electrode 252A and the cathodes 253

The gate electrode 255A receives a voltage applied by the gate-voltage control circuit 424 of the vertical drive circuit 420A. The gate-voltage control circuit 424 receives power from the power supply unit 600.

In the electron emission array 250A as described above, the cathodes 253 of a given unit area 256 emit electrons when both of the transistors 258*a* and 258*b* of this unit area 256 are turned on.

The vertical address circuit 421A of the vertical drive circuit 420A uses electron-emission-array control signals based on the amplitude of an output video signal as supplied from the control circuit 500A to control the voltage level and duration of the voltage applied to a vertical scan control line 430 in the horizontal blanking period Thb. Such control serves to adjust the amount of electrons emitted during the horizontal blanking period Thb in response to the amplitude of an output video signal.

The horizontal address circuit 411A of the horizontal drive circuit 410A uses electron-emission-array control signals based on the amplitude of an output video signal as supplied from the control circuit 500A to control the duration of the voltage applied to a horizontal scan control line 440 in the horizontal blanking period Thb. Such control serves to adjust the amount of electrons emitted during the above-noted horizontal blanking period Thb in response to the amplitude of an output video signal.

The configuration shown in FIG. 12 is directed to a case in which one of the vertical scan control lines Lv is selected to control the transistors 258*a* to perform a scan in the vertical direction, and one of the horizontal scan control lines Lh is selected to control the transistors 258*b* to perform a scan in the horizontal direction. Conversely, provision may be made such that a scan in the vertical direction is performed by controlling the transistors 258*b*, and a scan in the horizontal direction is performed by controlling the transistors 258*a*.

In this manner, the imaging apparatus of the present embodiment differs from the imaging apparatus of the first embodiment in that the elements driven to select a unit area 256 are provided in the electron emission array 250A. The drive method that will be described in the following is basically the same as the method of driving the imaging apparatus according to the first embodiment.

Figure 13A:
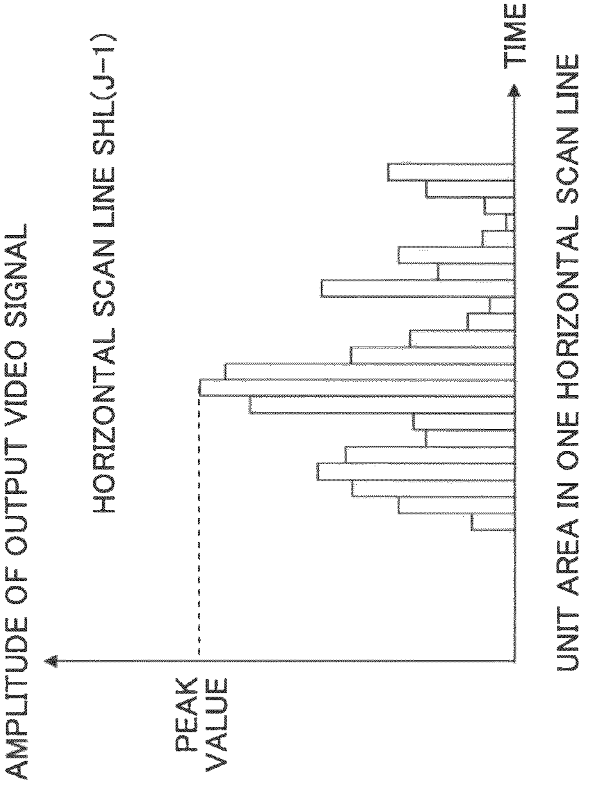
FIGS. 13A and 13B are drawings showing the amplitude of an output video signal obtained by reading holes accumulated in a photoelectric conversion film at the position opposite to unit areas by use of electrons emitted from the cathodes of these unit areas corresponding to two horizontal scan lines between which video signal output timings are different in the imaging apparatus of the second embodiment.
Figure 13B:
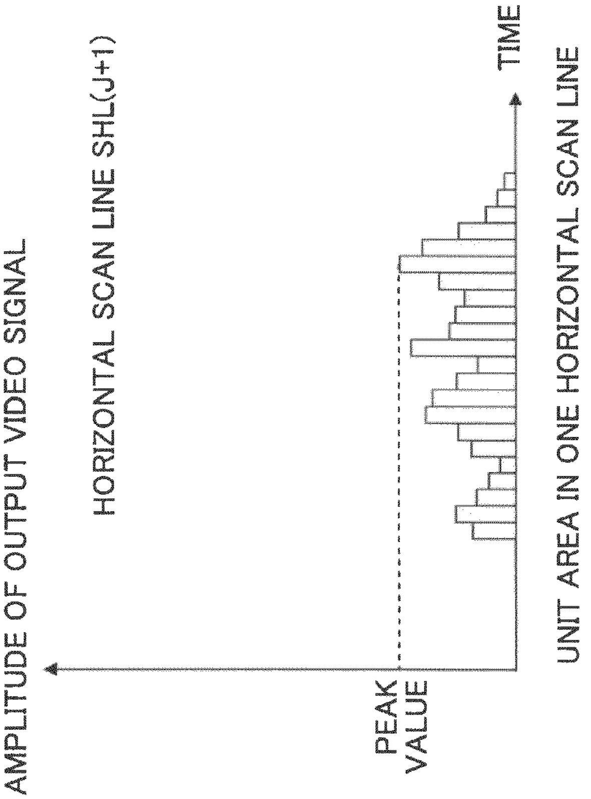

FIGS. 13A and 13B are drawings showing the amplitude of an output video signal obtained by reading holes accumulated in the photoelectric conversion film 230 at the position opposite to unit areas 256 by use of electrons emitted from the cathodes 253 of these unit areas 256 corresponding to two horizontal scan lines SHL(J−1) and SHL(J+1) between which video signal output timings are different.

In FIGS. 13A and 13B, the larger the amplitude of an output video signal, the higher the intensity of light (i.e., magnitude of light) incident to the corresponding portion of the photoelectric conversion film 230 is. Accordingly, an amplitude increase signifies an increase in the amount of residual holes and generated and accumulated holes existing in the photoelectric conversion film 230 that need to be removed during the horizontal blanking period Thb.

Conversely, the smaller the amplitude of an output video signal, the lower the intensity of light (i.e., magnitude of light) incident to the corresponding portion of the photoelectric conversion film 230 is. Accordingly, amplitude reduction signifies reduction in the amount of residual holes and generated and accumulated holes existing in the photoelectric conversion film 230 that need to be removed during the horizontal blanking period Thb.

Figure 14:
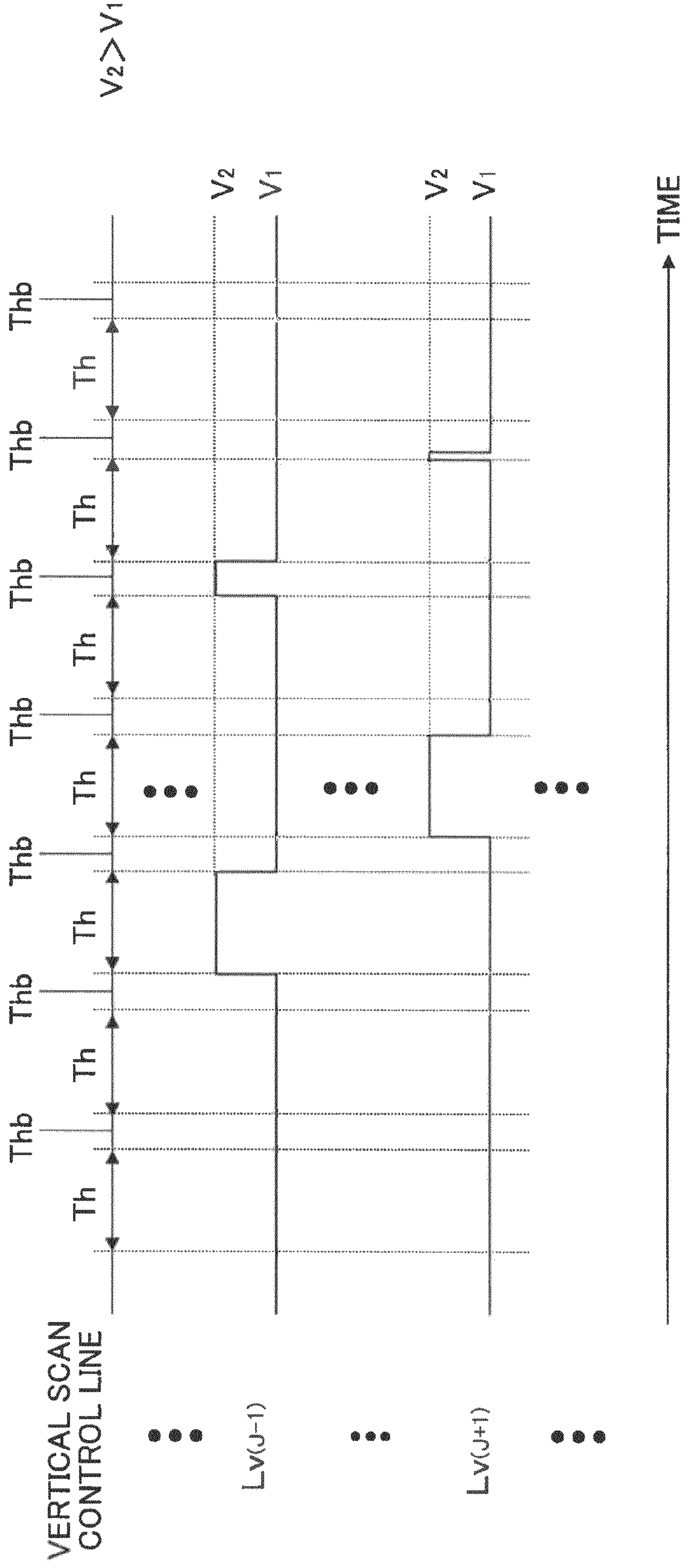
FIG. 14 is a drawing showing the amplitude and timing of pulse voltages applied to the vertical scan control lines Lv in the imaging apparatus of the second embodiment.

FIG. 14 is a drawing showing the amplitude and timing of pulse voltages applied to the vertical scan control lines 430 in the imaging apparatus of the present embodiment. In the drive system for driving the electron emission array 250A shown in FIG. 12, a peak value of an output video signal is detected with respect to each horizontal scan line 257 when the amplitude of the output video signal is obtained as shown in FIGS. 13A and 13B. In proportion to a change in the peak value, the duration of the voltage V2 applied to the vertical scan control line 430 in the horizontal blanking period Thb is changed.

Figure 15:
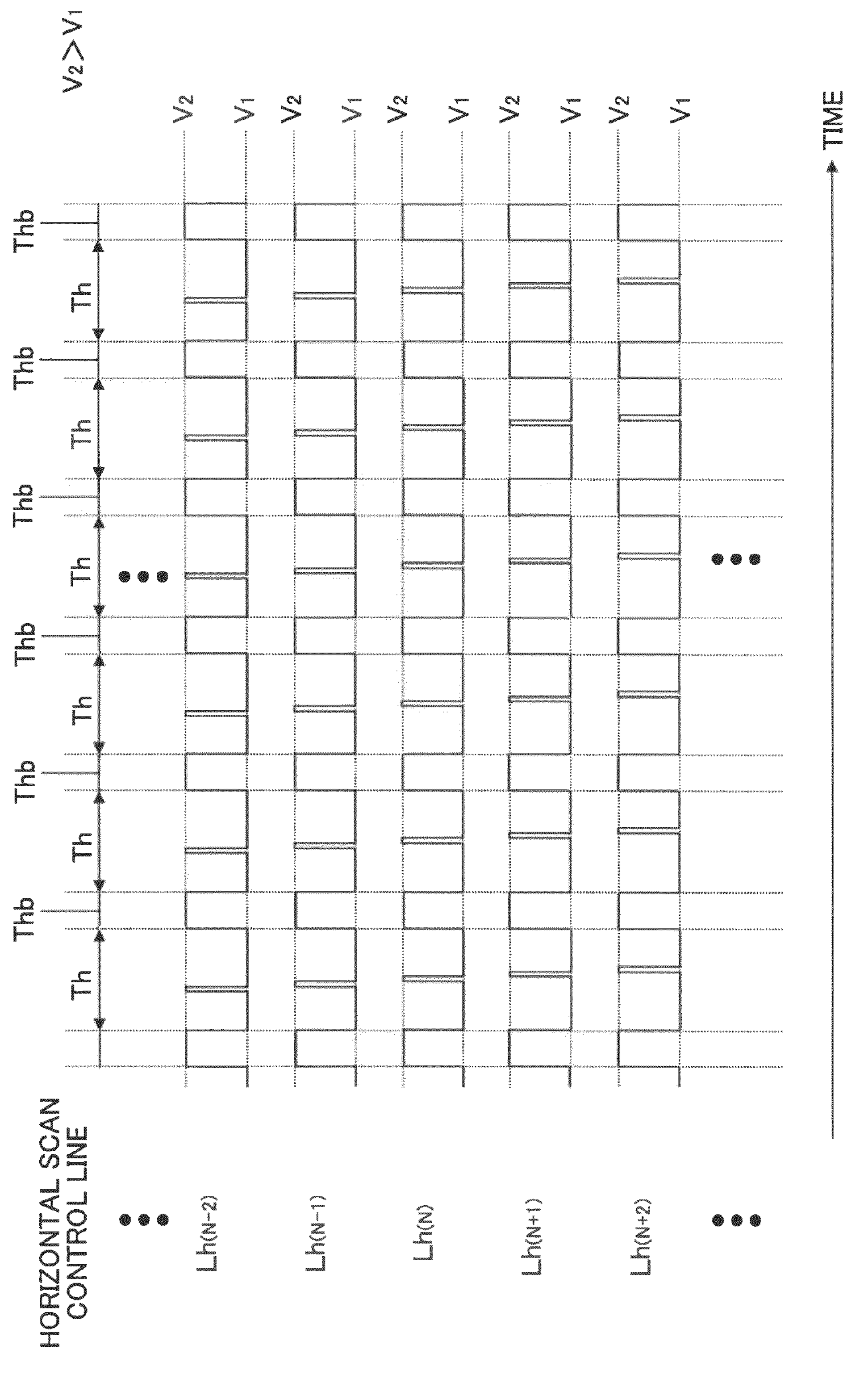
FIG. 15 is a drawing showing the amplitude and timing of pulse voltages applied to the horizontal scan control lines Lh in the imaging apparatus of the second embodiment.

FIG. 15 is a drawing showing the amplitude and timing of pulse voltages applied to the horizontal scan control line 440.

The gate electrode 255A receives a constant voltage Vx applied by the gate-voltage control circuit 424 of the vertical drive circuit 420A at all times (i.e., regardless of whether the video signal output period Th or the horizontal blanking period Thb is concerned).

As shown in FIG. 14, the voltage V2 is successively applied to the vertical scan control lines Lv. As shown in FIG. 15, the voltage V2 is successively applied to the horizontal scan control lines Lh. With these arrangements, the transistors 258*a* and 258*b* situated in the unit area 256 at the intersection between the activated vertical scan control line Lv and the activated horizontal scan control line Lh are made conductive.

As the transistors 258*a* and 258*b* in the unit area 256 are made conductive, the voltage Vx is applied to the gate electrode 255A, and voltage 0 V is applied to the cathodes 253. As a result, the cathodes 253 included in this unit area 256 emit electrons.

Namely, all the horizontal scan control lines Lh receive the voltage V2 in each horizontal blanking period Thb as shown in FIG. 15. When the voltage V2 is applied to a vertical scan control line Lv in the horizontal blanking period Thb, thus, all the elements included in the horizontal scan line 257 connected to this vertical scan control line Lv emit electrons.

As shown in FIG. 13A, the peak value of the output video signal is relatively high in the horizontal scan line SHL(J−1). For this horizontal scan line SHL(J−1), the duration of the voltage V2 applied to the vertical scan control line Lv(J−1) in the horizontal blanking period Thb may be set relatively longer as shown in FIG. 14 to increase the amount of electrons for use in the removal of residual holes and generated and accumulated holes in the photoelectric conversion film 230. This serves to remove a large amount of holes existing in the photoelectric conversion film 230.

As shown in FIG. 13B, the peak value of the output video signal is relatively low in the horizontal scan line SHL(J+1). For this horizontal scan line SHL(J+1), the duration of the voltage V2 applied to the vertical scan control line Lv(J+1) in the horizontal blanking period Thb may be set relatively shorter to decrease the amount of electrons for use in the removal of residual holes and generated and accumulated holes in the photoelectric conversion film 230. This serves to remove a small amount of holes existing in the photoelectric conversion film 230.

According to the imaging apparatus of the present embodiment described above, the duration of electron emission from the elements included in a given horizontal scan line 257 during the horizontal blanking period Thb is controlled in proportion to the peak value of a video signal already output from this horizontal scan line 257. The removal of holes is thus performed in response to the amount of light incident to the photoelectric conversion film 230. This makes it possible to suppress residual images and to achieve an electronic-shutter operation while reducing the load on the electron emission array 250A.

The arrangement shown in FIG. 14 is directed to a case in which the voltage V2 is continuously applied to a vertical scan control line Lv during the horizontal blanking period Thb. Alternatively, the voltage V2 may be intermittently (as pulses) applied to a vertical scan control line Lv. In such case, the total duration (or the number of pulses) of the intermittently applied voltage V2 may be controlled in proportion to a change in the peak value of the video signal output from the horizontal scan line 257.

Instead of or in addition to changing the duration of the voltage V2 applied to a vertical scan control line Lv, the duration of the voltage V2 applied to the horizontal scan control lines Lh may be controlled for the purpose of adjusting the amount of electrons emitted in the horizontal blanking period Thb in response to the peak value of an output video signal.

For example, the voltage V2 may be applied to a vertical scan control line Lv over the entirety of the horizontal blanking period Thb while the voltage V2 is applied continuously or intermittently (as pulses) to the horizontal scan control lines Lh. In such configuration, the duration or the number of pulses of the voltage V2 applied to the horizontal scan control lines Lh may be changed in response to the peak value of an output video signal.

The above-described embodiment has been directed to a case in which the constant voltage Vx is applied to the gate electrode 255A at all times. Alternatively, the voltage applied to the gate electrode 255A may be controlled in response to the peak value of an output video signal.

Figure 16:
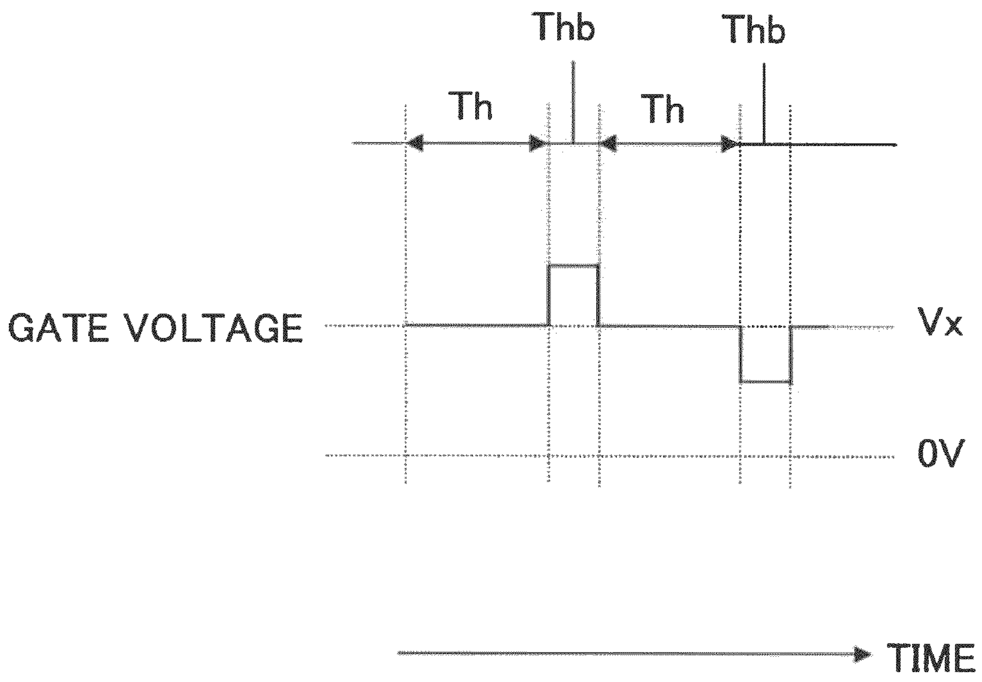
FIG. 16 is an illustrative drawing showing waveforms observed when changing a voltage applied to the gate electrodes in the horizontal blanking period Thb in the imaging apparatus of the second embodiment.

For example, the voltage V2 may be applied to a vertical scan control line Lv over the entirety of the horizontal blanking period Thb while the pulse voltages shown in FIG. 15 are applied to the horizontal scan control lines Lh. Then, the voltage level output from the gate-voltage control circuit 424 of the vertical drive circuit 420A may be changed in response to the peak value of an output video signal. With this provision, the voltage applied to the gate electrode 255A in the horizontal blanking period Thb is changed as shown in FIG. 16, thereby bringing about the same advantages as in the case in which the duration or the number of pulses of the voltage V2 applied to the horizontal scan control lines Lh or vertical scan control line Lv in the horizontal blanking period Thb is changed.

The embodiment described above has been directed to an example in which the voltage V2 is applied only during the horizontal blanking period Thb immediately following the second video signal output period Th occurring after the video signal output period Th of interest during which the voltage V2 is applied to a vertical scan control line Lv of interest. Alternatively, the voltage V2 may be applied in a plurality of horizontal blanking periods Thb, and the total duration of the applied voltage V2 may be changed in response to the peak value of an output video signal.

Figure 17:
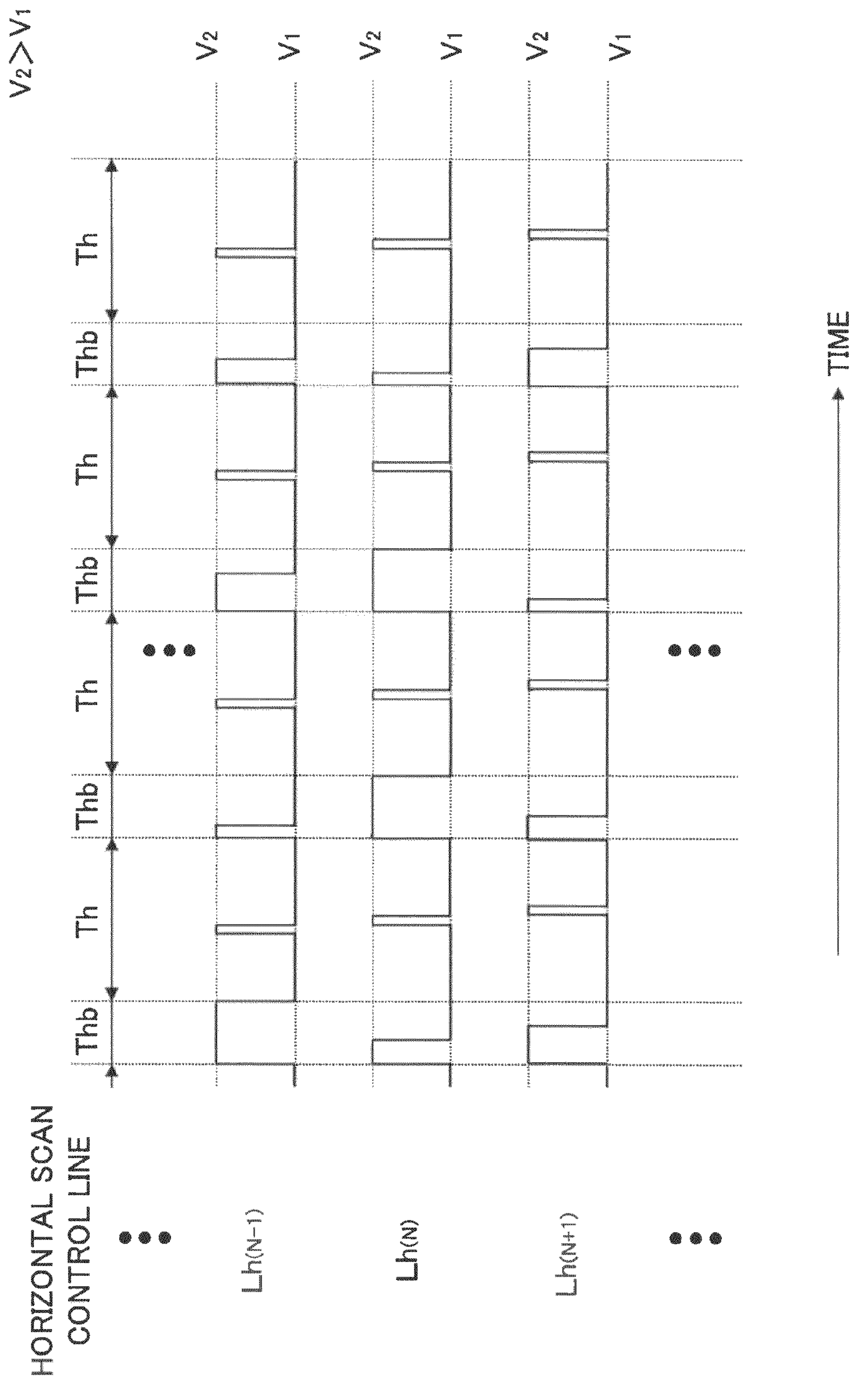
FIG. 17 is an illustrative drawing showing waveforms observed when changing the duration of a voltage applied to horizontal scan control lines Lh in the horizontal blanking period Thb in proportion to the amplitude of an output video signal in the imaging apparatus of the second embodiment.
Figure 18:
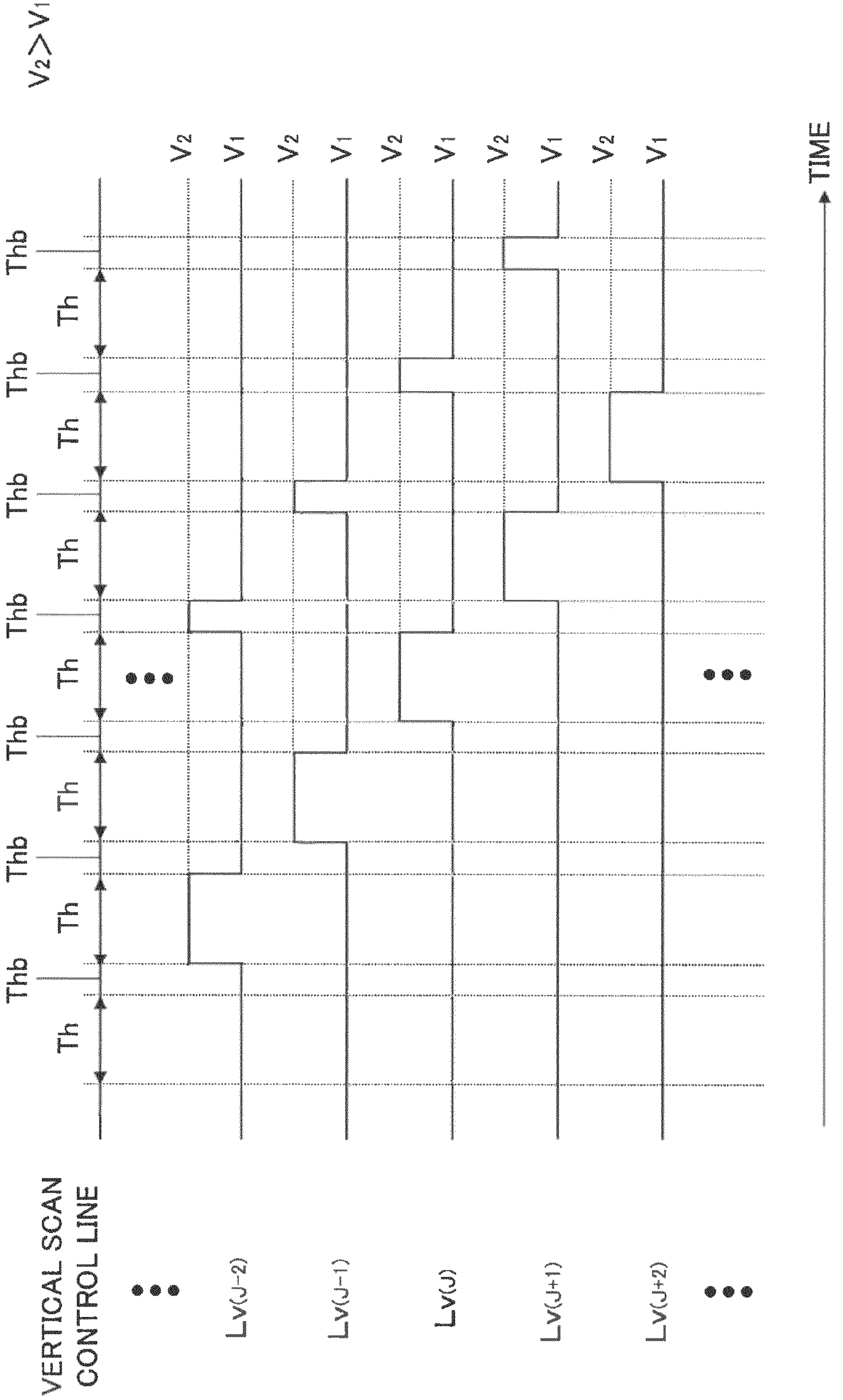
FIG. 18 is a drawing showing the amplitude and timing of pulse voltages applied to vertical scan control lines Lv when changing the duration of a voltage applied to horizontal scan control lines Lh in the horizontal blanking period Thb in proportion to the amplitude of an output video signal in the imaging apparatus of the second embodiment.

The embodiment described above has been directed to a configuration in which the amount of electrons emitted in the horizontal blanking period Thb from the cathodes 253 of all the unit areas 256 provided on a given horizontal scan line 257 is controlled in response the peak value of an output video signal obtained from this horizontal scan line 257. Alternatively, the duration of voltage V2 applied to each horizontal scan control line Lh in the horizontal blanking period Thb may be made to vary as shown in FIG. 17 in response to the peak value of an output video signal corresponding to a corresponding unit area 256 on a given horizontal scan line 257. In so doing, the pulse voltages shown in FIG. 18 are applied to a vertical scan control line Lv.

As a result, the residual holes and generated and accumulated holes existing in the photoelectric conversion film 230 can effectively be removed in accordance with amount of light incident to the photoelectric conversion film 230 at each unit area 256. Moreover, it is possible to remove residual images and to achieve an electronic-shutter operation while further reducing the load on the electron emission array 250A.

Figure 19:
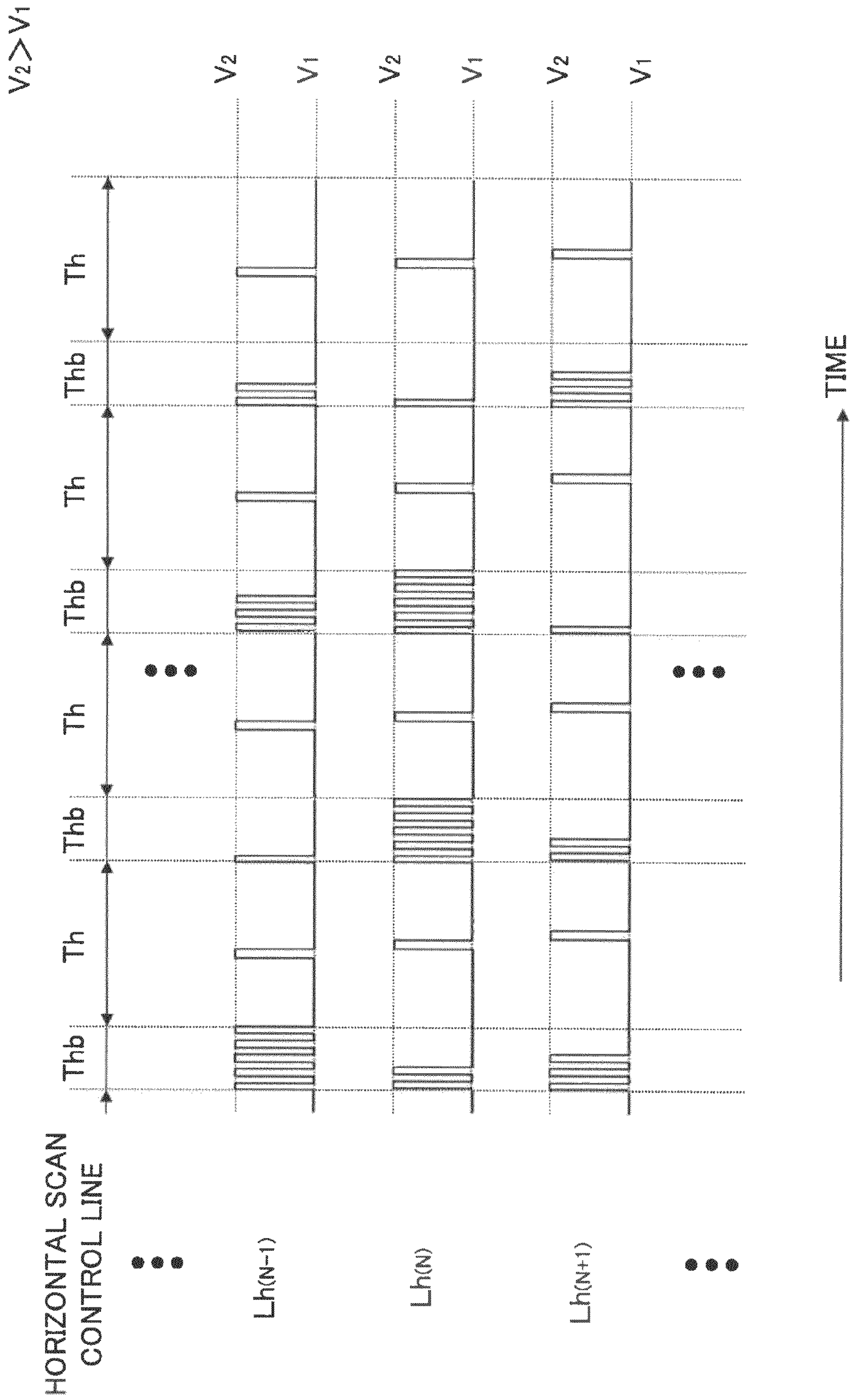
FIG. 19 is an illustrative drawing showing waveforms observed when changing the duration of a voltage intermittently applied to the horizontal scan control lines Lh in the horizontal blanking period Thb in response to the amplitude of an output video signal in the imaging apparatus of the second embodiment.

The configuration shown in FIG. 17 is directed to an example in which the voltage V2 is continuously applied to the horizontal scan control lines 440 in the horizontal blanking period Thb, and the duration of the applied voltage V2 (i.e., the duration in which the voltage V2 is applied) is changed in response to the amplitude of an output video signal corresponding to each unit area 256. Alternatively, as shown in FIG. 19, the voltage V2 may be applied intermittently (as pulses) to the horizontal scan control lines Lh in the horizontal blanking period Thb in response to the amplitude of an output voltage signal corresponding to each unit area 256, and the duration or number of pulses of the applied voltage V2 may be changed.

In the above descriptions of the imaging apparatus of the first and second embodiments, no mention has been made of a vertical blanking period. A portion of the vertical blanking period may be regarded as a horizontal blanking period Thb to perform the same operations to achieve the same advantages.

The descriptions of the imaging apparatus of exemplary embodiments have been provided heretofore. The present invention is not limited to these embodiments, but various variations and modifications may be made without departing from the scope of the present invention.

The present application is based on Japanese priority application No. 2007-134788 filed on May 21, 2007, with the Japanese Patent Office, the entire contents of which are hereby incorporated by reference.

What is claimed is:

1. An imaging apparatus, comprising:

an electron emission array having electron sources arranged in matrix form and having a plurality of horizontal scan lines;

a photoelectric conversion film opposed to the electron emission array; and a control and drive circuit configured to select one or more of the horizontal scan lines in a given video signal output period and to cause the electron sources included in the selected one or more horizontal scan lines to emit electrons toward the photoelectric conversion film to produce a video signal, wherein the control and drive circuit is further configured to cause the electron sources included in the selected one or more horizontal scan lines to emit electrons toward the photoelectric conversion film in any one or more blanking periods excluding both a blanking period immediately following the given video signal output period and a blanking period immediately preceding a next video signal output period in which the one or more horizontal scan lines will be selected next time.

2. The imaging apparatus as claimed in claim 1, wherein said any one or more blanking periods include a plurality of blanking periods intervening between an end of the given video signal output period and a start of the next video signal output period.

3. The imaging apparatus as claimed in claim 2, wherein the plurality of blanking periods includes a given blanking period and a blanking period next following the given blanking period.

4. The imaging apparatus as claimed in claim 1, wherein a blanking period during which electrons are emitted from the electron sources included in the selected one or more horizontal scan lines selected in the given video signal output period differs from a blanking period during which electrons are emitted from the electron sources included in one or more horizontal scan lines selected in another video signal output period.

5. The imaging apparatus as claimed in claim 2, wherein at least one of the plurality of blanking periods during which electrons are emitted from the electron sources included in the selected one or more horizontal scan lines selected in the given video signal output period differs from any one or more blanking periods during which electrons are emitted from the electron sources included in one or more horizontal scan lines selected in another video signal output period.

6. The imaging apparatus as claimed in claim 1, wherein said any one or more blanking periods during which electrons are emitted from the electron sources included in one of the selected one or more horizontal scan lines differ from said any one or more blanking periods during which electrons are emitted from the electron sources included in another one of the selected one or more horizontal scan lines.

7. The imaging apparatus as claimed in claim 1, wherein the electron emission array includes a first electrode for emitting electrons and a second electrode for creating a potential gap with the first electrode, and a potential gap is created between the first electrode and the second electrode to draw out electrons from the first electrode.

8. The imaging apparatus as claimed in claim 7, wherein a potential gap created between the first electrode and the second electrode in said any one or more blanking periods is set larger than a potential gap created between the first electrode and the second electrode in the given video signal output period.

9. The imaging apparatus as claimed in claim 7, wherein at least one of the first electrode and the second electrode receives a voltage in said any one or more blanking periods, said voltage being identical to a voltage applied in the given video signal output period.

10. The imaging apparatus as claimed in claim 1, wherein the photoelectric conversion film is configured to generate electric charge therein in response to light arriving from an external source, and is configured to amplify the electric charge therein.

11. The imaging apparatus as claimed in claim 1, further comprising a signal level detecting unit configured to detect a signal level of the video signal output from the selected one or more horizontal scan lines in the given video signal output period, wherein a time length during which electrons are emitted from the electron sources included in the selected one or more horizontal scan lines toward the photoelectric conversion film in said any one or more blanking periods varies depending on the signal level of the video signal detected by the signal level detecting unit.

12. The imaging apparatus as claimed in claim 7, wherein further comprising a signal level detecting unit configured to detect a signal level of the video signal output from the selected one or more horizontal scan lines in the given video signal output period, wherein a potential gap created between the first electrode and the second electrode in the electron sources included in the selected one or more horizontal scan lines in said any one or more blanking periods varies depending on the signal level of the video signal detected by the signal level detecting unit.

* * * * *